(12) United States Patent
Morita

(10) Patent No.: US 9,590,738 B2
(45) Date of Patent: Mar. 7, 2017

(54) CURRENT VOLTAGE CONVERSION CIRCUIT, LIGHT RECEIVING APPARATUS, AND LIGHT TRANSMISSION SYSTEM

(71) Applicant: Sony Corporation, Tokyo (JP)

(72) Inventor: Hiroshi Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 236 days.

(21) Appl. No.: 14/460,874

(22) Filed: Aug. 15, 2014

(65) Prior Publication Data

US 2015/0071654 A1 Mar. 12, 2015

(30) Foreign Application Priority Data

Sep. 6, 2013 (JP) ................................ 2013-185449

(51) Int. Cl.
*H04B 10/02* (2006.01)
*H04B 10/06* (2006.01)
(Continued)

(52) U.S. Cl.
CPC ......... *H04B 10/501* (2013.01); *H03F 1/0277* (2013.01); *H03F 1/223* (2013.01);
(Continued)

(58) Field of Classification Search
CPC .... H04B 10/06; H04B 10/504; H04B 10/508; H04B 10/6931; H03F 3/087
(Continued)

(56) References Cited

U.S. PATENT DOCUMENTS 4,612,514 A * 9/1986 Shigaki .................. H03F 1/342
330/277
5,498,993 A * 3/1996 Ohtsuka ............... H03K 17/795
250/214 C
(Continued)

FOREIGN PATENT DOCUMENTS

JP 2012-257070 12/2012

OTHER PUBLICATIONS

SeekIC, Current / voltage basic conversion circuit composed of operational amplifier, http://www.seekic.com/circuit_diagram/Basic_circuit/current_voltage_basic_conversion_circuit_composed_of_operational_amplifier.html, Fig. 3.*

*Primary Examiner* — David Payne
*Assistant Examiner* — Pranesh Barua
(74) *Attorney, Agent, or Firm* — Michael Best & Friedrich LLP

(57) ABSTRACT

A current voltage conversion circuit includes first to fourth signal amplifiers; and first and second resistive passive elements, an input terminal of the first signal amplifier being connected to a terminal for inputting a current signal, one and the other terminals of the first resistive passive element being connected to output and input terminals of the first signal amplifier, respectively, an input terminal of the second signal amplifier being connected to a first connection point, input and output terminals of the third signal amplifier being connected to an output terminal of the second signal amplifier and the first connection point, respectively, an input terminal of the fourth signal amplifier being connected to a second connection point, and one and the other terminals of the second resistive passive element being connected to an output terminal of the fourth signal amplifier and the second connection point.

14 Claims, 17 Drawing Sheets

(51) Int. Cl.
*H04B 10/50* (2013.01)
*H03F 1/02* (2006.01)
*H03F 1/22* (2006.01)
*H03F 3/08* (2006.01)
*H03F 3/45* (2006.01)
*H03F 3/72* (2006.01)
*H03G 3/30* (2006.01)

(52) U.S. Cl.
CPC ......... *H03F 3/085* (2013.01); *H03F 3/45251* (2013.01); *H03F 3/72* (2013.01); *H03G 3/3084* (2013.01); *H03F 2200/408* (2013.01); *H03F 2200/411* (2013.01); *H03F 2200/528* (2013.01); *H03F 2203/45694* (2013.01)

(58) Field of Classification Search
USPC ........................................ 398/182, 202, 206
See application file for complete search history.

(56) References Cited

U.S. PATENT DOCUMENTS

| | | | | |
|---|---|---|---|---|
| 6,624,405 | B1* | 9/2003 | Lau | G01R 31/2884 250/214 A |
| 8,264,282 | B1* | 9/2012 | Riekki | H03F 1/301 330/260 |
| 2004/0075484 | A1* | 4/2004 | Nishizono | H03F 3/087 327/345 |
| 2004/0184387 | A1* | 9/2004 | Shirasaka | G11B 7/1275 369/124.1 |
| 2006/0034620 | A1* | 2/2006 | Day | H03F 1/26 398/202 |
| 2007/0212081 | A1* | 9/2007 | Takahashi | H04B 10/66 398/202 |
| 2008/0101592 | A1* | 5/2008 | Wu | H04L 25/028 379/399.01 |
| 2008/0317406 | A1* | 12/2008 | Santori | H04B 10/803 385/24 |
| 2012/0170944 | A1* | 7/2012 | Yagisawa | H04B 10/6911 398/200 |
| 2013/0163995 | A1* | 6/2013 | Uemura | H04B 10/504 398/136 |

* cited by examiner

CURRENT VOLTAGE CONVERSION CIRCUIT, LIGHT RECEIVING APPARATUS, AND LIGHT TRANSMISSION SYSTEM

CROSS REFERENCE TO RELATED APPLICATIONS

This application claims the benefit of Japanese Priority Patent Application JP 2013-185449 filed Sep. 6, 2013, the entire contents of which are incorporated herein by reference.

BACKGROUND

The present disclosure relates to a current voltage conversion circuit, a light receiving apparatus and a light transmission system, more particularly, to a current voltage conversion circuit, a light receiving apparatus and a light transmission system being capable of transmitting a signal at a high data rate with a circuit having a smaller area.

SUMMARY

In a light transmission system where data provided by electrically converting an electrical signal is transmitted from a light transmission apparatus, and electrically converting a light data received at a light receiving apparatus in the related art, a transimpedance amplifier (TIA) is used as a current voltage conversion circuit for electrically converting light data in the light receiving apparatus.

The electrical signal outputted from a driver of the light transmission apparatus is optically converted by an electrical/optical conversion element (for example, Laser Diode, VCSEL (Vertical Cavity Surface Emitting LASER) etc.), and is transmitted via an optical fiber. Then, a current signal that is optical/electrical converted by a light receiving element (for example, Photo Diode) is converted to a voltage signal by the transimpedance amplifier. As a relatively high transmission data rate, i.e., 10 Gbps or more, is demanded in the light transmission, the transimpedance amplifier should have a wide bandwidth.

For example, Japanese Patent Application Laid-open No. 2012-257070 discloses a transimpedance amplifier having both a wide bandwidth in gain frequency properties and group delay flattening properties.

When a light signal is transmitted from a light transmission apparatus to a light receiving apparatus, a power loss is increased at a connection part of optical fibers, upon electrical/optical conversion or optical/electrical conversion. Therefore, the signal may be attenuated, and amplitude of the current signal outputted by the light receiving element may be small. Thus, the transimpedance amplifier should have a high SNR (Signal Noise Ratio). In the related art, a high capacity filter is demanded in order to remove a noise component, thereby increasing a circuit area.

In view of the circumstances as described above, it is desirable that a signal can be transmitted at a high data rate with a circuit having a smaller area.

According to an embodiment of the present disclosure, there is provided a current voltage conversion circuit, including: first to fourth signal amplifiers for amplifying an input signal at a predetermined gain; and first and second resistive passive elements for providing a predetermined resistivity value, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

According to an embodiment of the present disclosure, there is provided a light receiving apparatus, including: a light receiving element for receiving a light signal to be optically/electrically converted, and outputting a current signal corresponding to the light signal, and a current voltage conversion circuit for converting a current signal outputted from the light receiving element into a voltage signal, the current voltage conversion circuit, including: first to fourth signal amplifiers for amplifying an input signal at a predetermined gain; and first and second resistive passive elements for providing a predetermined resistivity value, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

According to an embodiment of the present disclosure, there is provided a light transmission system, including: a light transmission apparatus including a current voltage conversion circuit for converting a signal light transmitted into a current signal, and a light source for an optical communication for converting the current signal converted in the current voltage conversion circuit into a light signal, and a light receiving apparatus including a light receiving element for receiving the light signal to be optically/electrically converted via a light transmission path, and outputting a current signal corresponding to the light signal, and a current voltage conversion circuit for converting a current signal outputted from the light receiving element into a voltage signal, the current voltage conversion circuit, including: first to fourth signal amplifiers for amplifying an input signal at a predetermined gain; and first and second resistive passive elements for providing a predetermined resistivity value, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

In an embodiment of the present disclosure, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
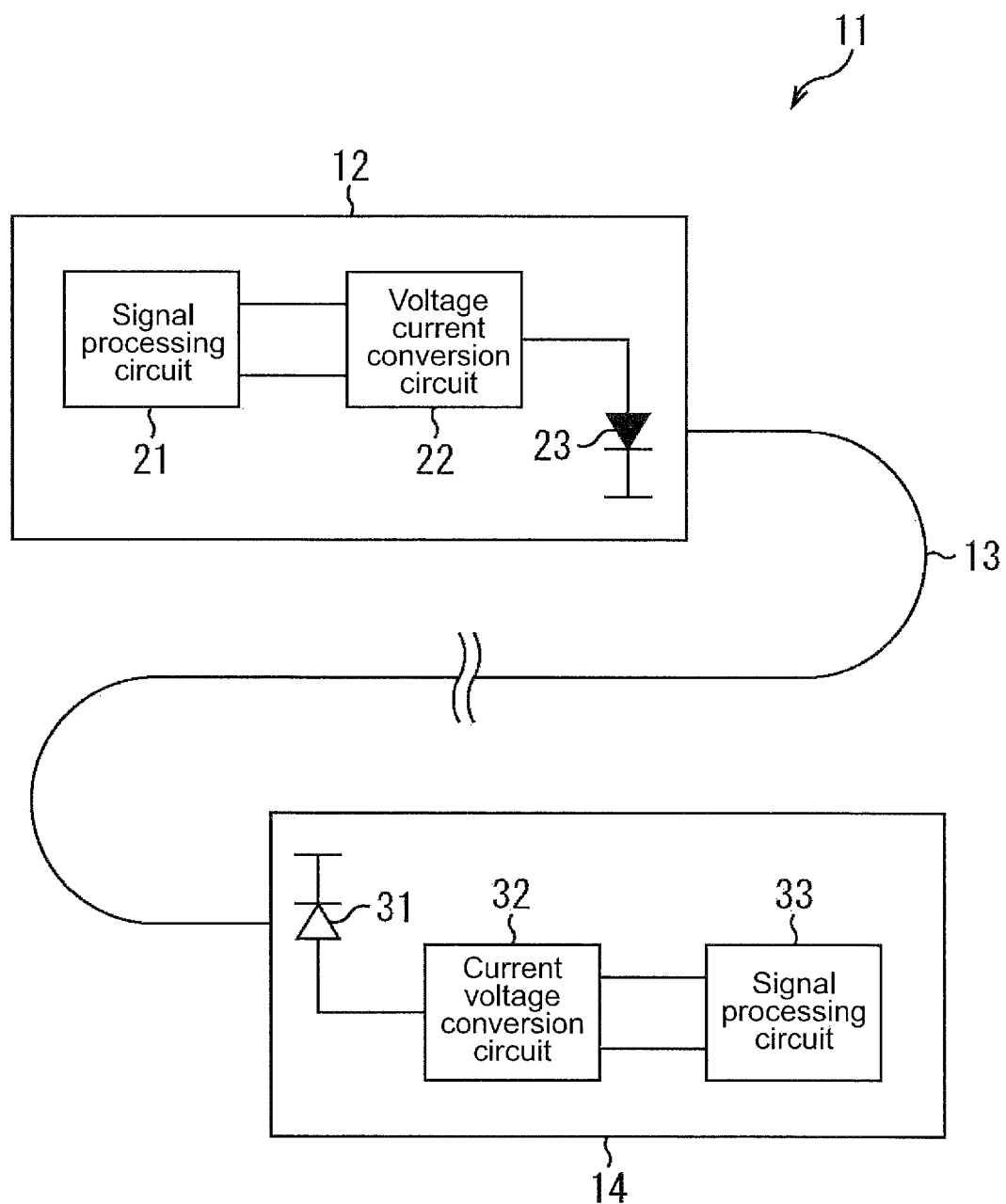
FIG. 1 is a block diagram showing a configuration embodiment of a light transmission system according to the present disclosure.

FIG. 1 is a block diagram showing a light transmission system according to a configuration embodiment of the present disclosure. In the present specification, the system refers to a whole apparatus composed of a plurality of apparatuses.

As shown in FIG. 1, a light transmission system 11 includes a light transmission apparatus 12 and a light receiving apparatus 14 connected via a light transmission path 13 such as an optical fiber, and a light signal is transmitted from the light transmission apparatus 12 to the light receiving apparatus 14.

The light transmission apparatus 12 is configured to have a signal processing circuit 21, a voltage current conversion circuit 22 and a light source for an optical communication 23. The light receiving apparatus 14 is configured to have a light receiving element 31, a current voltage conversion circuit 32 and a signal processing circuit 33.

The signal processing circuit 21 performs a signal processing to generate a signal corresponding to data to be light-transmitted, and supplies a differential signal to the voltage current conversion circuit 22.

The voltage current conversion circuit 22 converts the differential signal supplied from the signal processing circuit 21 into a current signal, and supplies the current signal to the light source for an optical communication 23.

The light source for an optical communication 23 transmits a light signal that is converted from the current signal supplied from the voltage current conversion circuit 22 into light via the light transmission path 13. As the light source for an optical communication 23, a semiconductor laser such as a vertical cavity surface emitting laser (VCSEL) is used, for example.

The light receiving element 31 receives the light signal transmitted from the light source for an optical communication 23 via the light transmission path 13 to be optically/electrically converted, and outputs a current signal corresponding to the light signal.

The current voltage conversion circuit 32 supplies the differential signal provided by converting the current signal outputted from the light receiving element 31 into a voltage signal into the signal processing circuit 33.

The signal processing circuit 33 performs a signal processing to the differential signal supplied from the current voltage conversion circuit 32, and receives data light-transmitted from the light transmission apparatus 12.

In the light transmission system 11 configured in this way, it is demanded that a signal is transmitted at a high data rate, while a circuit area is prevented from increasing.

Before the current voltage conversion circuit 32 according to an embodiment of the present disclosure is described, the current voltage conversion circuit in the related art will be described referring to FIGS. 2 to 5.

Figure 2:
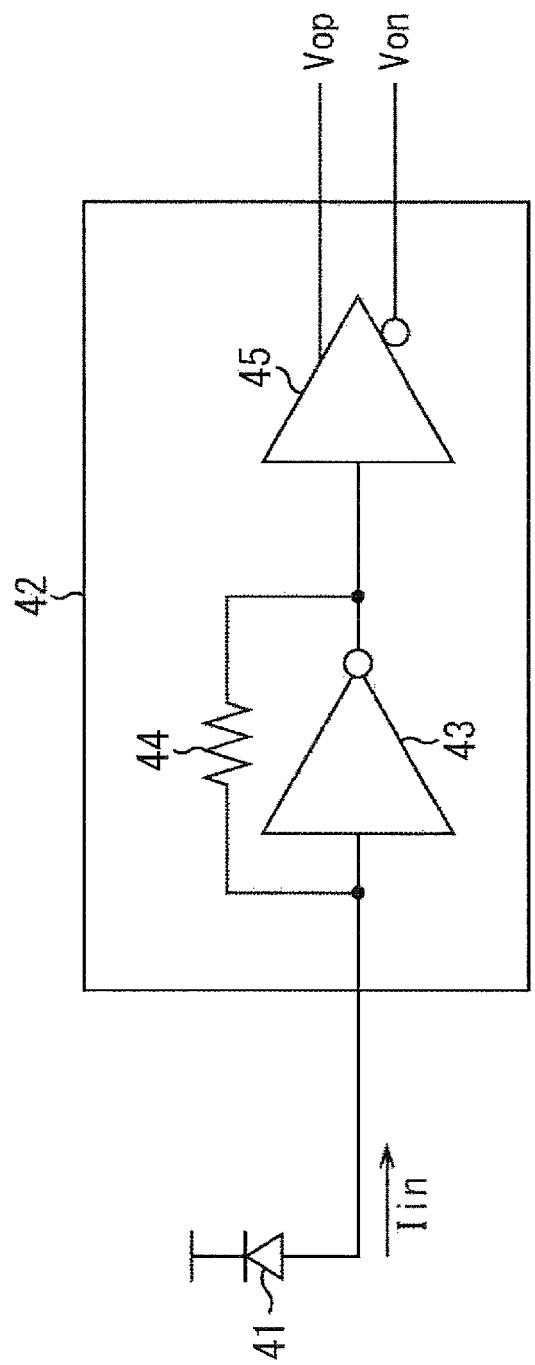
FIG. 2 shows a typical connection between a light receiving element and a current voltage conversion circuit in the related art.

FIG. 2 shows a typical connection between a light receiving element 41 and a current voltage conversion circuit 42 in the related art.

The light receiving element 41 outputs a current signal Iin corresponding to a light signal similar to the light receiving element 31 shown in FIG. 1. The current voltage conversion circuit 42 converts the current signal Iin into a voltage signal and outputs differential signals Vop and Von.

The current voltage conversion circuit 42 is configured of an amplifier 43, a feedback resistor 44 and an amplifier 45. An input terminal of the amplifier 43 is connected to the light receiving element 41, an output terminal of the amplifier 43 is connected to one terminal of the feedback resistor 44, the other terminal of the feedback resistor 44 is connected to the input terminal of the amplifier 43, and the input terminal of the amplifier 43 is connected to an input terminal of the amplifier 45.

In the current voltage conversion circuit 42 configured in this way, a current voltage conversion unit composed of the amplifier 43 and the feedback resistor 44 converts the current signal Iin into a voltage signal, and a differential conversion unit composed of the amplifier 45 differentiates a single end signal.

Figure 3:
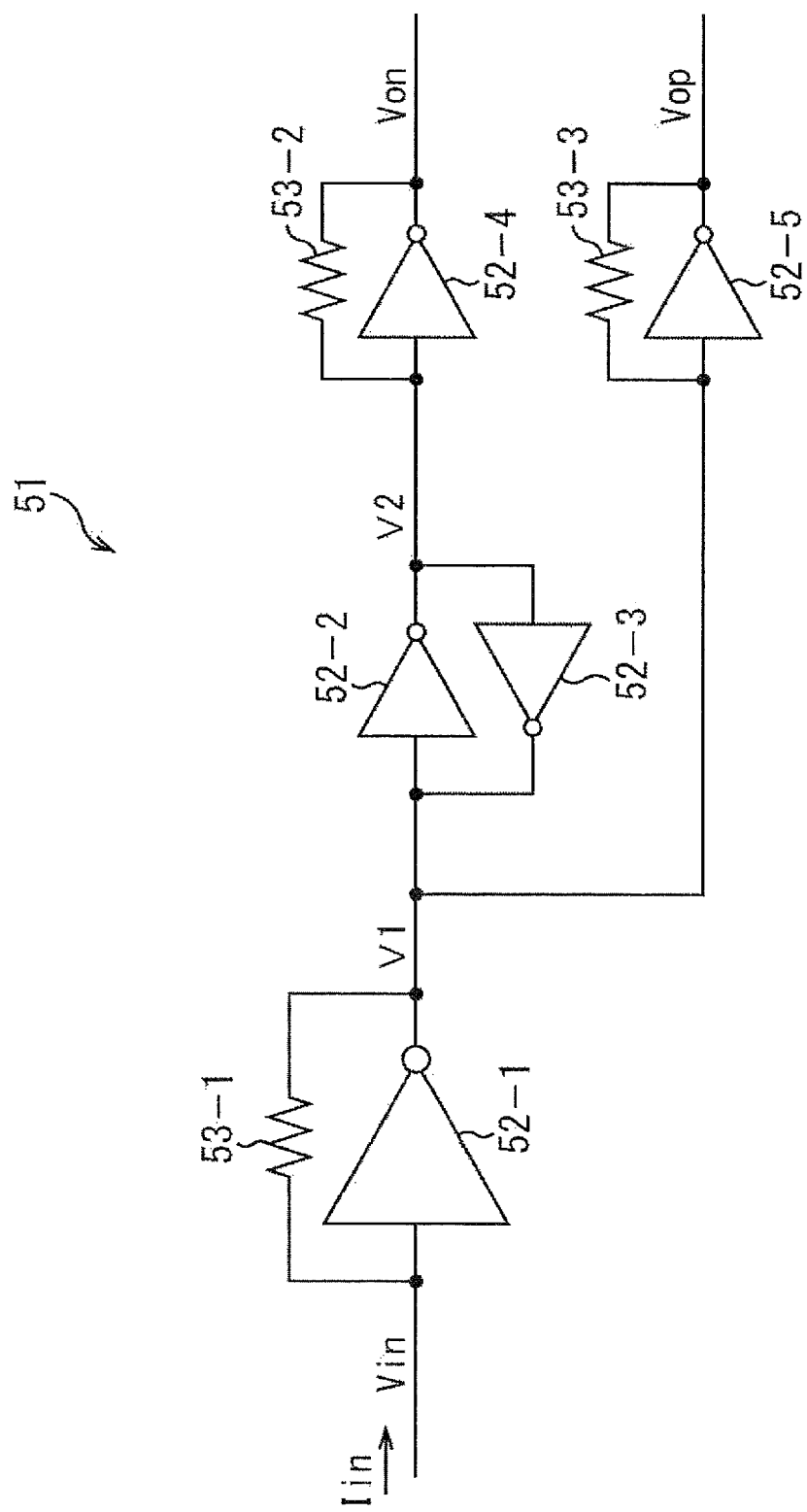
FIG. 3 shows a current voltage conversion circuit in the related art having other circuit configuration.

FIG. 3 shows a current voltage conversion circuit 51 in the related art having a circuit configuration different from the current voltage conversion circuit 42.

As shown in FIG. 3, the current voltage conversion circuit 51 is configured of amplifiers 52-1 and 52-2, a feedback amplifier 52-3, amplifiers 52-4 and 52-5 and feedback resistors 53-1 to 53-3.

In the current voltage conversion circuit 51, an input terminal of the amplifier 52-1 is connected to a light receiving element (not shown), an output terminal of the amplifier 52-1 is connected to one terminal of the feedback resistor 53-1, and the other terminal of the feedback resistor 53-1 is connected to the input terminal of the amplifier 52-1. In addition, a node V1 to which the output terminal of the amplifier 52-1 and one terminal of the feedback resistor 53-1 are connected is connected to an input terminal of the amplifier 52-2, the output terminal of the amplifier 52-2 is connected to an input terminal of the feedback amplifier 52-3, and the output terminal of the feedback amplifier 52-3 is connected to the node V1.

Moreover, a node V2 to which the output terminal of the amplifier 52-2 and the input terminal of the feedback amplifier 52-3 are connected is connected to the input terminal of the amplifier 52-4, the output terminal of the amplifier 52-4 is connected to one terminal of the feedback resistor 53-2, and the other terminal of the feedback resistor 53-2 is connected to the node V2. Further, the node V1 is connected to the input terminal of the amplifier 52-5, the output terminal of the amplifier 52-5 is connected to one terminal of the feedback resistor 53-3, and the other terminal of the feedback resistor 53-3 is connected to the node V1.

In the current voltage conversion circuit 51, to the node V1 at a latter part of the amplifier 52-1 and the feedback resistor 53-1, the amplifier 52-2 and the feedback amplifier 52-3 are connected, and the amplifier 52-5 and the feedback resistor 53-3 are also connected.

In the current voltage conversion circuit 51 having the above-described circuit configuration, the current signal Iin from the light receiving element (not shown) is converted into a voltage signal at the amplifier 52-1 and the feedback resistor 53-1, the differential signal Von is generated at the later amplifier 52-2, the feedback amplifier 52-3, the amplifier 52-4 and the feedback resistor 53-2, and the differential signal Vop is generated at the amplifier 52-5 and the feedback resistor 53-3.

Also, in the current voltage conversion circuit 51, when an input impedance Zz viewed from the node V2 of the circuit composed of the amplifier 52-4 and the feedback resistor 53-2 and the input impedance Zz viewed from the node V1 of the circuit composed of the amplifier 52-5 and the feedback resistor 53-3 are low, a band of a transimpedance ZT1 (=V1/Iin) of the circuit composed of the first part amplifier 52-1 and the feedback resistor 53-1 is significantly decreased.

Figure 4A:
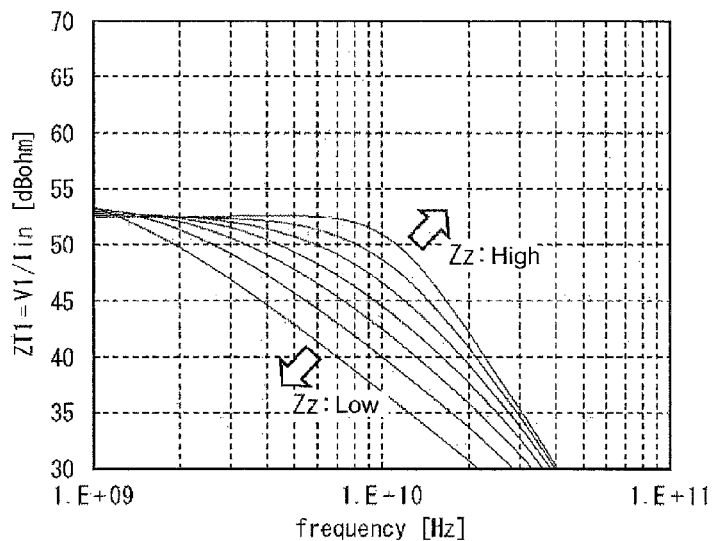
FIGS. 4A, 4B and 4C each shows frequency properties of the current voltage conversion circuit in the related art.

For example, FIG. 4A shows frequency properties of the transimpedance ZT1 when the input impedance Zz has a plurality of different values. A vertical axis represents the transimpedance ZT1 [dBohm], and a horizontal axis represents a frequency [Hz]. As shown in FIG. 4A, as the input impedance Zz is low, the band of the transimpedance Zz is significantly decreased.

Thus, in the current voltage conversion circuit 51 in the related art, with the significant decrease in the band of the transimpedance ZT1, a jitter is increased, thereby increasing a data error rate. It is difficult to perform a high data rate transmission.

On the other hand, when the input impedance Zz is high, the transimpedance ZT1 can have high band. However, in this case, the band of a voltage gain A2 (=V2/V1) of the amplifier 52-2 and the feedback amplifier 52-3 is decreased.

Figure 4B:
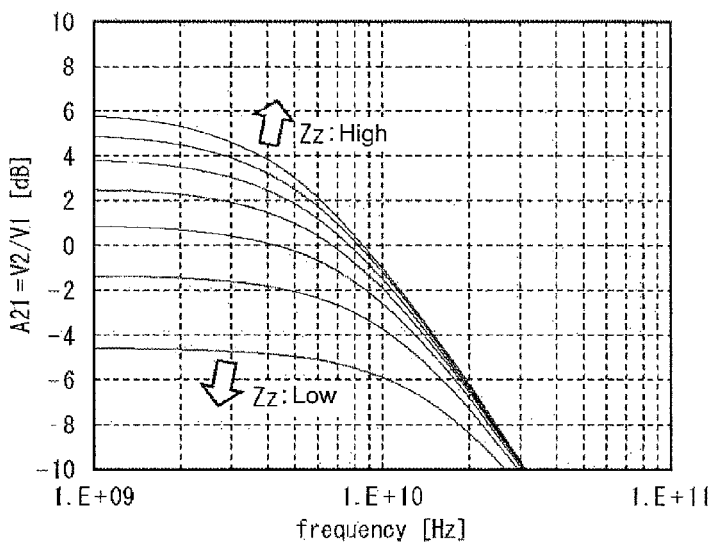

FIG. 4B shows frequency properties of the voltage gain A2 when the input impedance Zz has a plurality of different values. A vertical axis represents the voltage gain A2 [dB], and a horizontal axis represents a frequency [Hz]. As shown in FIG. 4B, as the input impedance Zz is high, the band of the voltage gain A2 is decreased. In other words, when the input impedance Zz is high, the band is undesirable.

Thus, due to an effect of the decrease in the band of the voltage gain A2, the band of the transimpedance ZT2 (=V2/Iin) of the circuit composed of the amplifier 52-1 and the feedback resistor 53-1 and of the amplifier 52-2 and the feedback amplifier 52-3 is limited.

Figure 4C:
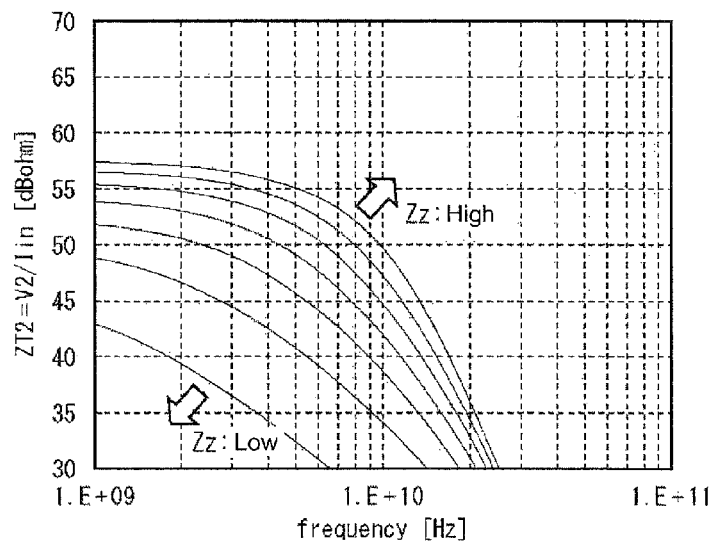

FIG. 4C shows frequency properties of a transimpedance ZT2 when the input impedance Zz has a plurality of different values. A vertical axis represents the transimpedance ZT2 [dBohm], and a horizontal axis represents a frequency [Hz]. As shown in FIG. 4C, the band of the transimpedance ZT2 is limited to about 5 GHz.

Figure 5A:
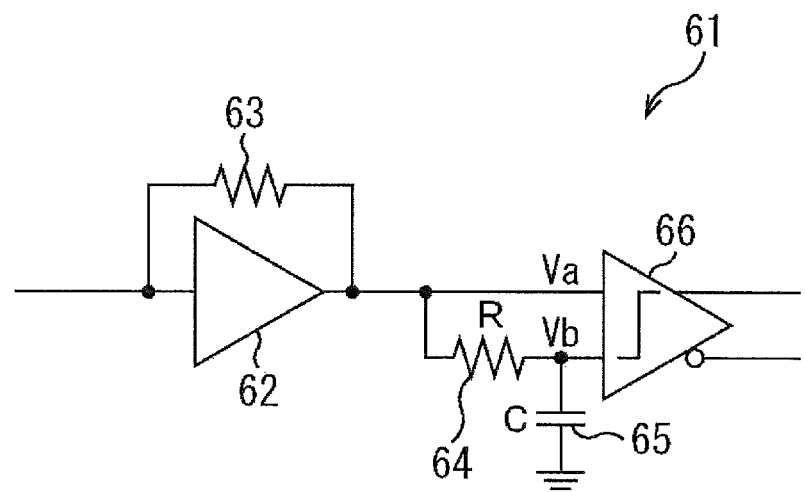
FIGS. 5A and 5B are views each for illustrating a typical single end differential conversion circuit.
Figure 5B:
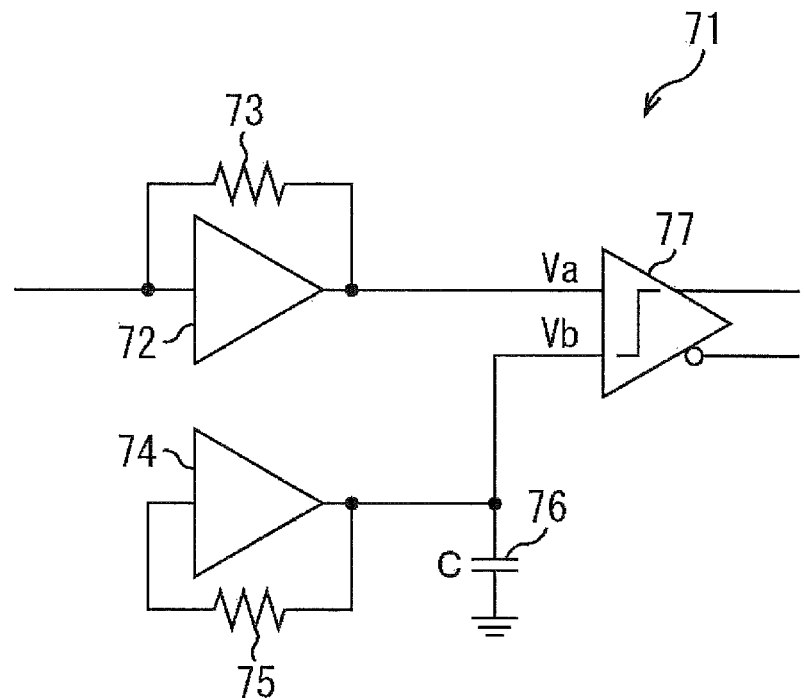

Referring to FIGS. 5A and 5B, a typical single end differential conversion circuit will be described.

FIG. 5A shows a circuit configuration of an RC type single end differential conversion circuit 61 and FIG. 5B shows a circuit configuration of a dummy type single end differential conversion circuit 71.

As shown in FIG. 5A, the RC type single end differential conversion circuit 61 is configured of an amplifier 62, a feedback resistor 63, a resistance 64, a capacitor 65 and an amplifier 66.

The RC type single end differential conversion circuit 61 is configured to extract a DC component from a main signal using a low pass filter (a noise suppression filter) composed of the resistance 64 and the capacitor 65, and generate a reference potential Vb.

In general, in the RC type single end differential conversion circuit 61, the sizes of the resistance 64 and the capacitor 65 are great in size, although they depend on cut-off frequencies of the low pass filter. For example, when a light signal is transmitted from a light transmission apparatus to a light receiving apparatus, a power insertion loss to an optical fiber or a power loss upon electrical/optical conversion and optical/electrical conversion is increased. Amplitude of an output current of the light receiving element may be small. In this case, it is demanded that the single end differential conversion circuit 61 has high signal-to-noise ratio. In order to remove noise component generated at the reference potential Vb, a high capacity capacitor 65 is necessary as the filter, thereby increasing the surface area.

Also, as shown in FIG. 5B, the dummy type single end differential conversion circuit 71 is composed of an amplifier 72, a feedback resistor 73, an amplifier 74, a feedback resistor 75, a capacitor 76 and an amplifier 77.

The dummy type single end differential conversion circuit 71 is configured such that a dummy circuit equivalent to a main path is configured by the amplifier 74 and the feedback resistor 75 and the reference potential Vb is generated from the dummy circuit.

However, in the single end differential conversion circuit 71, the dummy circuit composed of the amplifier 74 and the feedback resistor 75 may have undesirably a high consumption power and a large circuit area, and the capacitor 76 functioning as the noise suppression filter may also have undesirably a large area.

Thus, the current voltage conversion circuit in the related art has a disadvantage that the circuit area is increased. It is therefore demanded that a high data rate transmission is provided while an increase in the circuit area is avoided.

Figure 6:
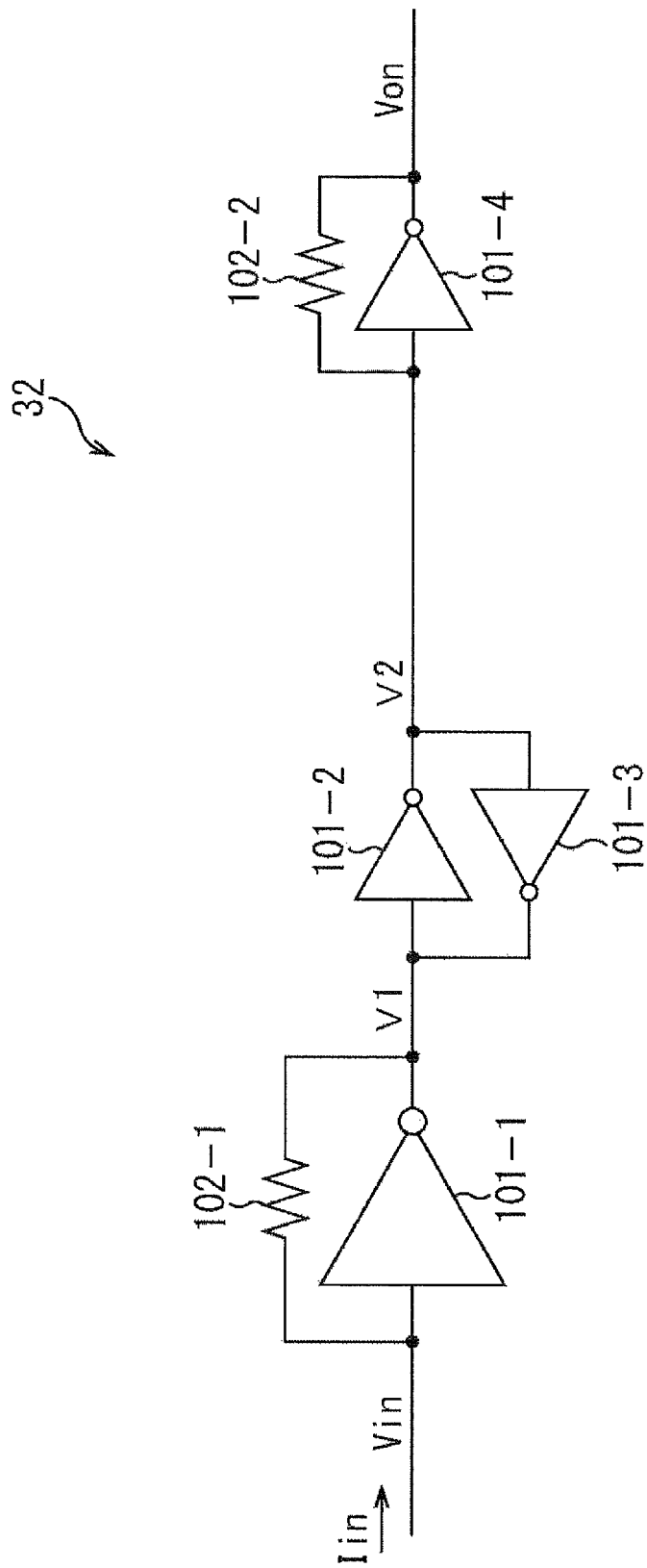
FIG. 6 shows a configuration of a current voltage conversion circuit according to a first embodiment of the present disclosure.

FIG. 6 is a block diagram showing a configuration of the current voltage conversion circuit 32 according to a first embodiment of the present disclosure.

As shown in FIG. 6, the current voltage conversion circuit 32 is composed of amplifiers 101-1 and 101-2, a feedback amplifier 101-3, an amplifier 101-4 and feedback resistors 102-1 and 102-2. The amplifiers 101-1 and 101-2, the feedback amplifier 101-3 and the amplifier 101-4 amplify an inputted signal at a predetermined gain, and the feedback resistors 102-1 and 102-2 are passive elements for providing a predetermined electrical resistivity value.

In the current voltage conversion circuit 32, the input terminal of the amplifier 101-1 is connected to the terminal of the light receiving element 31 (FIG. 1) for inputting the current signal Iin. The output terminal of the amplifier 101-1 is connected to one terminal of the feedback resistor 102-1, and the input terminal of the amplifier 101-1 is connected to the other terminal of the feedback resistor 102-1. The node V1 to which the output terminal of the amplifier 101-1 and one terminal of the feedback resistor 102-1 are connected is connected to the input terminal of the amplifier 101-2.

Also, the output terminal of the amplifier 101-2 is connected to the input terminal of the feedback amplifier 101-3, and the output terminal of the feedback amplifier 101-3 is connected to the node V1. The node V2 to which the output terminal of the amplifier 101-2 and the input terminal of the feedback amplifier 101-3 are connected is connected to the input terminal of the amplifier 101-4, the output terminal of the amplifier 101-4 is connected to one terminal of the feedback resistor 102-2, and the other terminal of the feedback resistor 102-2 is connected to the node V2.

Thus, the current voltage conversion circuit 32 has the circuit configuration that to the node V1 at a latter part of the amplifier 101-1 and the feedback resistor 102-1, only the amplifier 101-2 and the feedback amplifier 101-3 are connected, and to the node V2 at a latter part, the amplifier 101-4 and the feedback resistor 102-2 are connected.

Figure 7A:
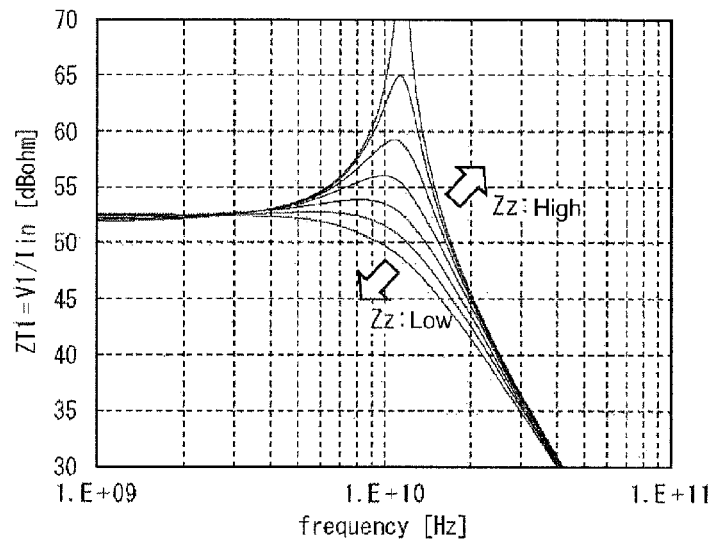
FIGS. 7A, 7B and 7C each shows frequency properties of the current voltage conversion circuit.

In the current voltage conversion circuit 32 having such a circuit configuration, the frequency properties of the transimpedance ZT1 (=V1/Iin) of the first part amplifier 101-1 are shown in FIG. 7A according to input impedance Zz viewed from the node V2 of the circuit composed of the amplifier 101-2 and the feedback resistor 102-2.

FIG. 7A shows the frequency properties of the transimpedance ZT1 when the input impedance Zz has a plurality of different values. A vertical axis represents the transimpedance ZT1 [dBohm], and a horizontal axis represents a frequency [Hz].

As shown in FIG. 7A, in the current voltage conversion circuit 32, the transimpedance ZT1 is amplified at high frequencies from the effects of the input impedance Zz and the feedback amplifier 101-3, and an amplified amount in a high frequency band is high even when the input impedance Zz is low. In other words, it shows that the current voltage conversion circuit 32 can reduce a decrease in gain due to a parasitic capacity.

Figure 7B:
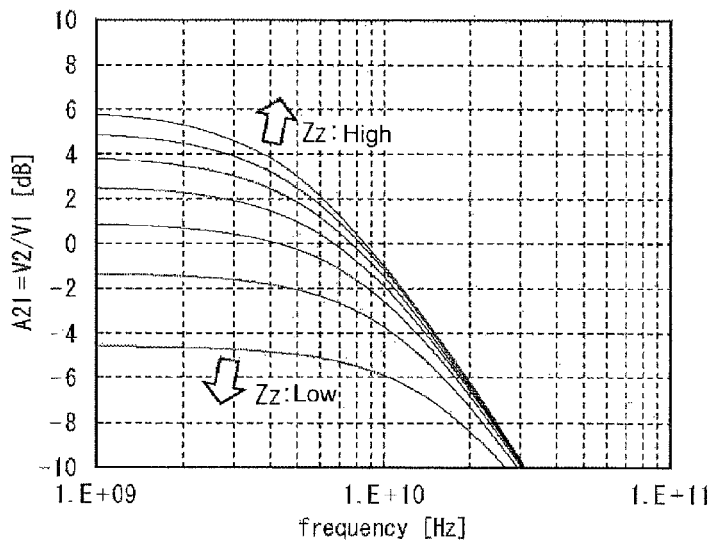

A decrease in the voltage gain A2 in the high frequency band upon passing through the amplifier 101-2 is shown in FIG. 7B similar to the above-described FIG. 4B. Accordingly, in order to cancel the decrease in the voltage gain A2 in the high frequency band upon passing through the amplifier 101-2, the current voltage conversion circuit 32 is set in advance such that the transimpedance ZT1 of the amplifier 101-1 has a peak in the high frequency band.

Figure 7C:
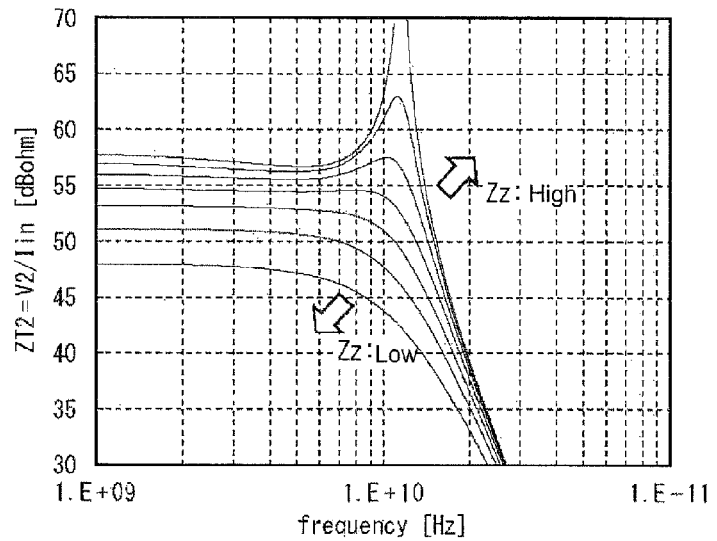

By this setting, in the current voltage conversion circuit 32, the frequency properties of the transimpedance ZT2 (=V2/Iin) can be flat in the high frequency band as shown in FIG. 7C. FIG. 7C shows the frequency properties of the transimpedance ZT2 when the input impedance Zz has a plurality of different values. A vertical axis represents the transimpedance ZT2 [dBohm], and a horizontal axis represents a frequency [Hz].

Thus, the current voltage conversion circuit 32 can have better pass properties in the high frequency band than that of the current voltage conversion circuit 51 in the related shown in FIG. 3. The light receiving apparatus 14 including the current voltage conversion circuit 32 having the pass properties (FIG. 1) can transmit a signal at high data rate.

Figure 8A:
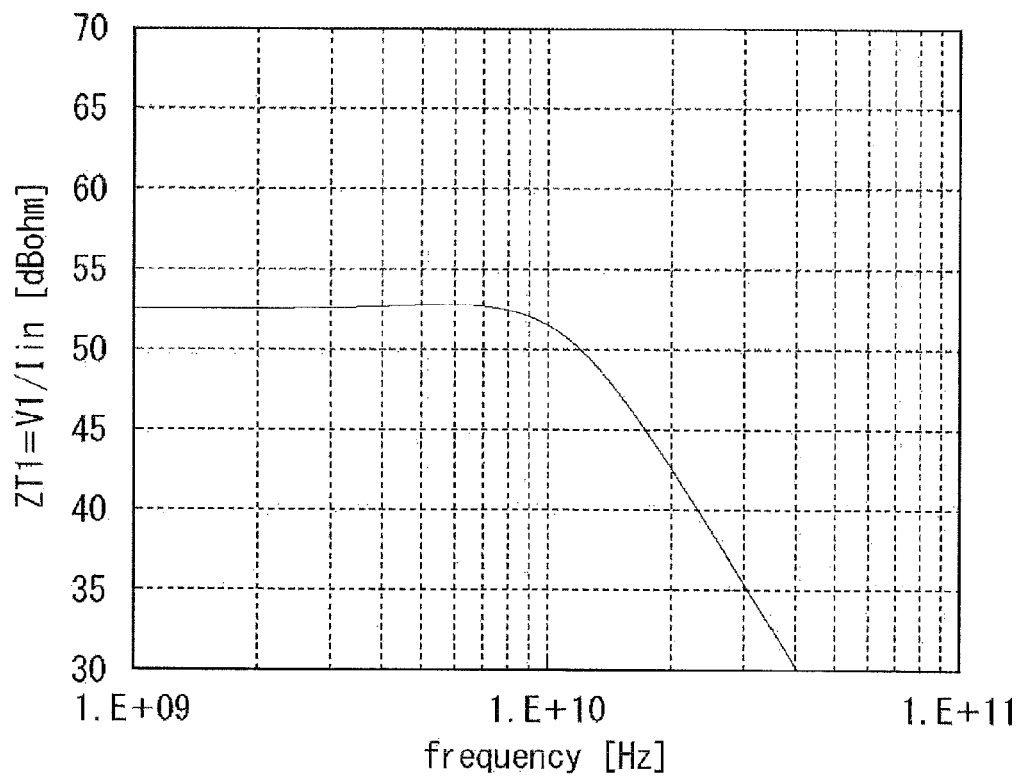
FIGS. 8A and 8B are each for comparing the frequency properties in a configuration having the same transistor size.
Figure 8B:
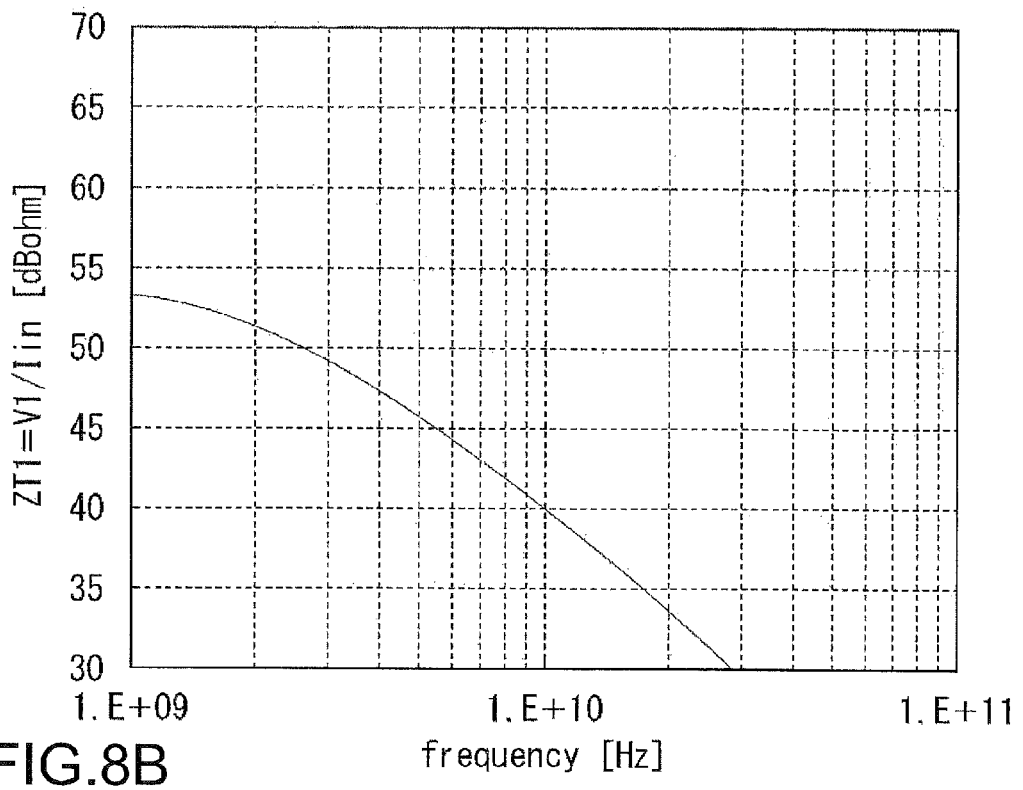

For example, referring to FIGS. 8A and 8B, the frequency properties of the current voltage conversion circuits 32 and 51 having the same transistor size are compared. FIG. 8A shows the transimpedance ZT1 of the current voltage conversion circuit 32, and FIG. 8B shows the transimpedance ZT1 of the current voltage conversion circuit 51 in the related art.

As shown in FIGS. 8A and 8B, the pass properties in the high frequency band of the transimpedance ZT1 of the current voltage conversion circuit 32 are better than those of the current voltage conversion circuit 51 in the related art.

Figure 9:
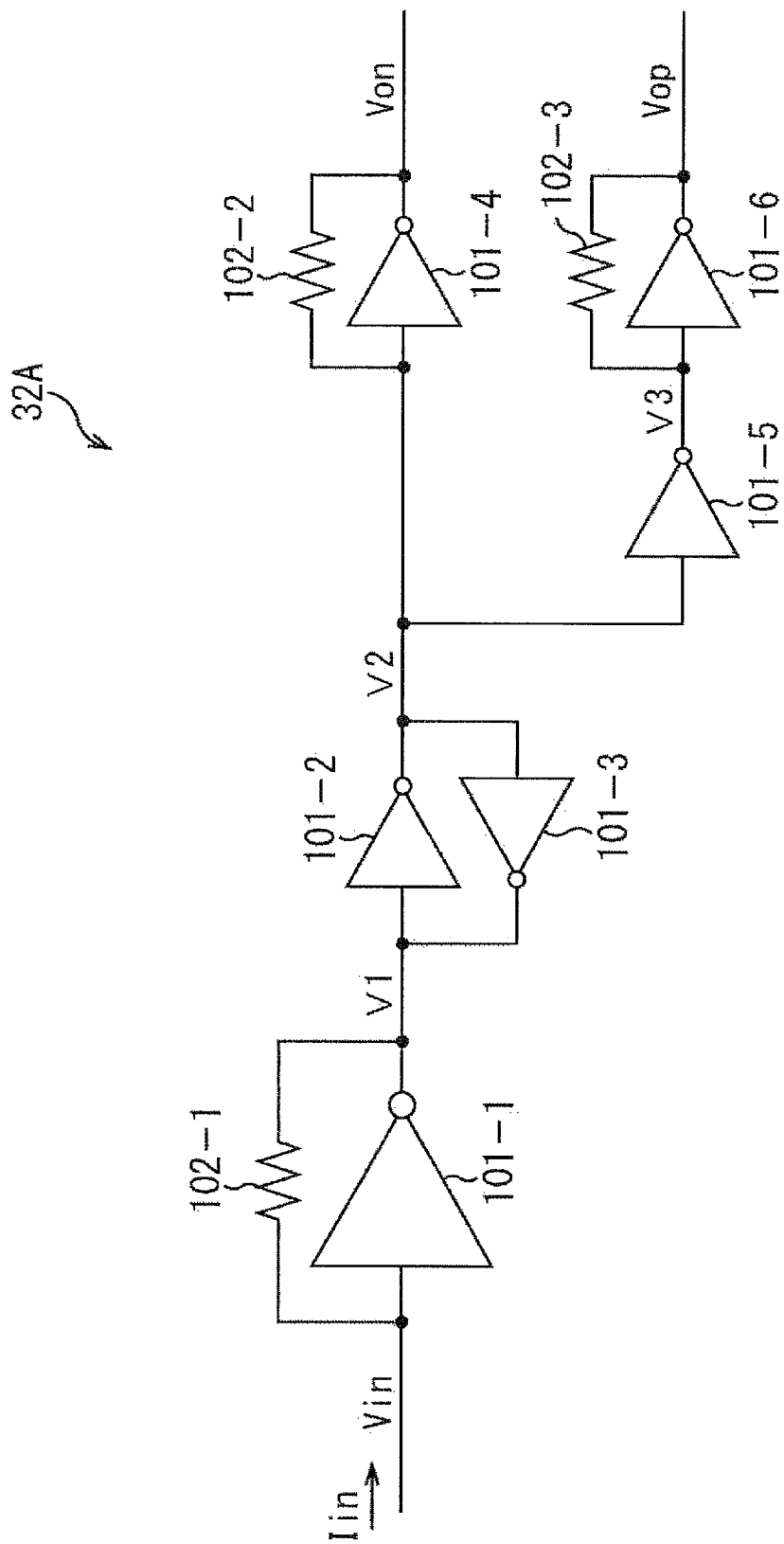
FIG. 9 is a block diagram showing a configuration of a current voltage conversion circuit according to a second embodiment of the present disclosure.

Next, FIG. 9 is a block diagram showing a configuration of the current voltage conversion circuit 32 according to a second embodiment of the present disclosure.

As shown in FIG. 9, a current voltage conversion circuit 32A is configured to have the amplifiers 101-1 and 101-2, the feedback amplifier 101-3, the amplifier 101-4, an amplifier for generating a reverse phase signal 101-5, an amplifier 101-6 and the feedback resistors 102-1 to 102-3.

In the current voltage conversion circuit 32A, the input terminal of the amplifier 101-1 is connected to the terminal of the light receiving element 31 (FIG. 1) for inputting the current signal Iin. The output terminal of the amplifier 101-1 is connected to one terminal of the feedback resistor 102-1, and the input terminal of the amplifier 101-1 is connected to the other terminal of the feedback resistor 102-1. The node V1 to which the output terminal of the amplifier 101-1 and one terminal of the feedback resistor 102-1 are connected is connected to the input terminal of the amplifier 101-2.

Also, the output terminal of the amplifier 101-2 is connected to the input terminal of the feedback amplifier 101-3, and the output terminal of the amplifier 103-1 is connected to the node V1. The node V2 to which the output terminal of the amplifier 101-2 and the input terminal of the feedback amplifier 101-3 are connected is connected to the input terminal of the amplifier 101-4, the output terminal of the amplifier 101-4 is connected to one terminal of the feedback resistor 102-2, and the other terminal of the feedback resistor 102-2 is connected to the node V2.

The node V2 is connected to the input terminal of the amplifier for generating a reverse phase signal 101-5, and the output terminal of the amplifier for generating a reverse phase signal 101-5 is connected to the input terminal of the amplifier 101-6. The output terminal of the amplifier 101-6 is connected to one terminal of the feedback resistor 102-3, and the other terminal of the feedback resistor 102-3 is connected to a node V3 to which the output terminal of the amplifier for generating a reverse phase signal 101-5 and the input terminal of the amplifier 101-6 are connected.

In the current voltage conversion circuit 32A, to the node V1 at a latter part of the amplifier 101-1 and the feedback resistor 102, only the amplifier 101-2 and the feedback amplifier 101-3 are connected, and to the node V2 at a latter part, the amplifier 101-4 and the feedback resistor 102-2 are connected. To the node V2, the amplifier for generating a reverse phase signal 101-5 is connected. To the node V3 at a latter part of the amplifier for generating a reverse phase signal 101-5, the amplifier 101-6 and the feedback resistor 102-3 are connected.

Figure 10A:
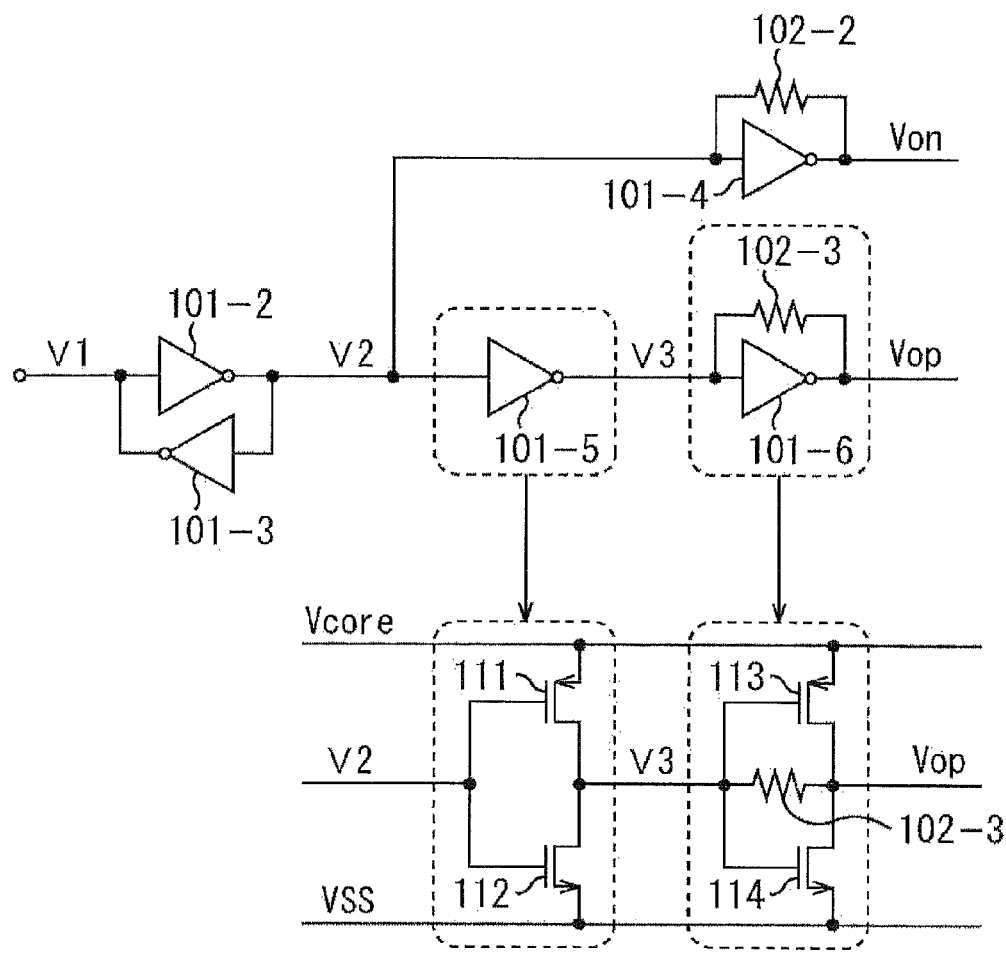
FIG. 10A shows an amplifier for generating a reverse phase signal of the current voltage conversion circuit and FIG. 10B shows an equivalent circuit of the amplifier.

FIG. 10A shows equivalent circuits of the amplifier for generating a reverse phase signal 101-5 and the amplifier 101-6 in the current voltage conversion circuit 32A.

Figure 10B:
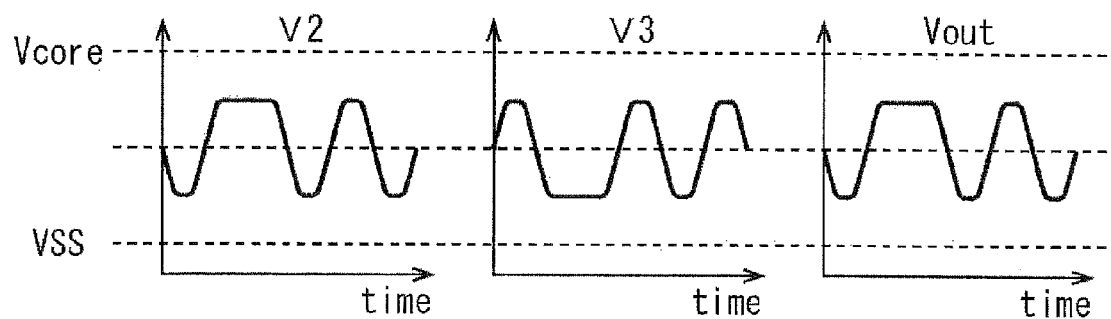

As shown in FIG. 10A, the amplifier for generating a reverse phase signal 101-5 is configured to have a combination of a P type MOS transistor 111 and an N type MOS transistor 112, and the amplifier 101-6 includes a combination of a P type MOS transistor 113 and an N type MOS transistor 114. As shown in FIG. 10B, a potential of the node V2, a potential of the node V3, a potential of the node Von and a potential of the node Vop (Vout) are determined by a self-bias of the feedback resistor 102-2. In this way, the current voltage conversion circuit 32A does not demand a low pass filter and a dummy circuit.

By controlling the feedback resistor 102-3, gains of the feedback resistor 102-2 and the feedback resistor 102-3 are matched and gains of the amplifier 101-4 and the amplifier 101-6 are matched, thereby setting a gain of the amplifier for generating a reverse phase signal 101-5 to single fold. In this way, a gain of a positive signal Vop (=Von/V2) and a gain of a negative signal Von (=Vop/V2) can be matched.

In this way, the current voltage conversion circuit 32A does not demand the low pass filter such as the single end differential conversion circuit 61 and the dummy circuit such as the single end differential conversion circuit 71 as described above referring to FIG. 5. Accordingly, the current voltage conversion circuit 32A can have good pass properties in the high frequency band with the circuit configuration having a smaller area.

Figure 11:
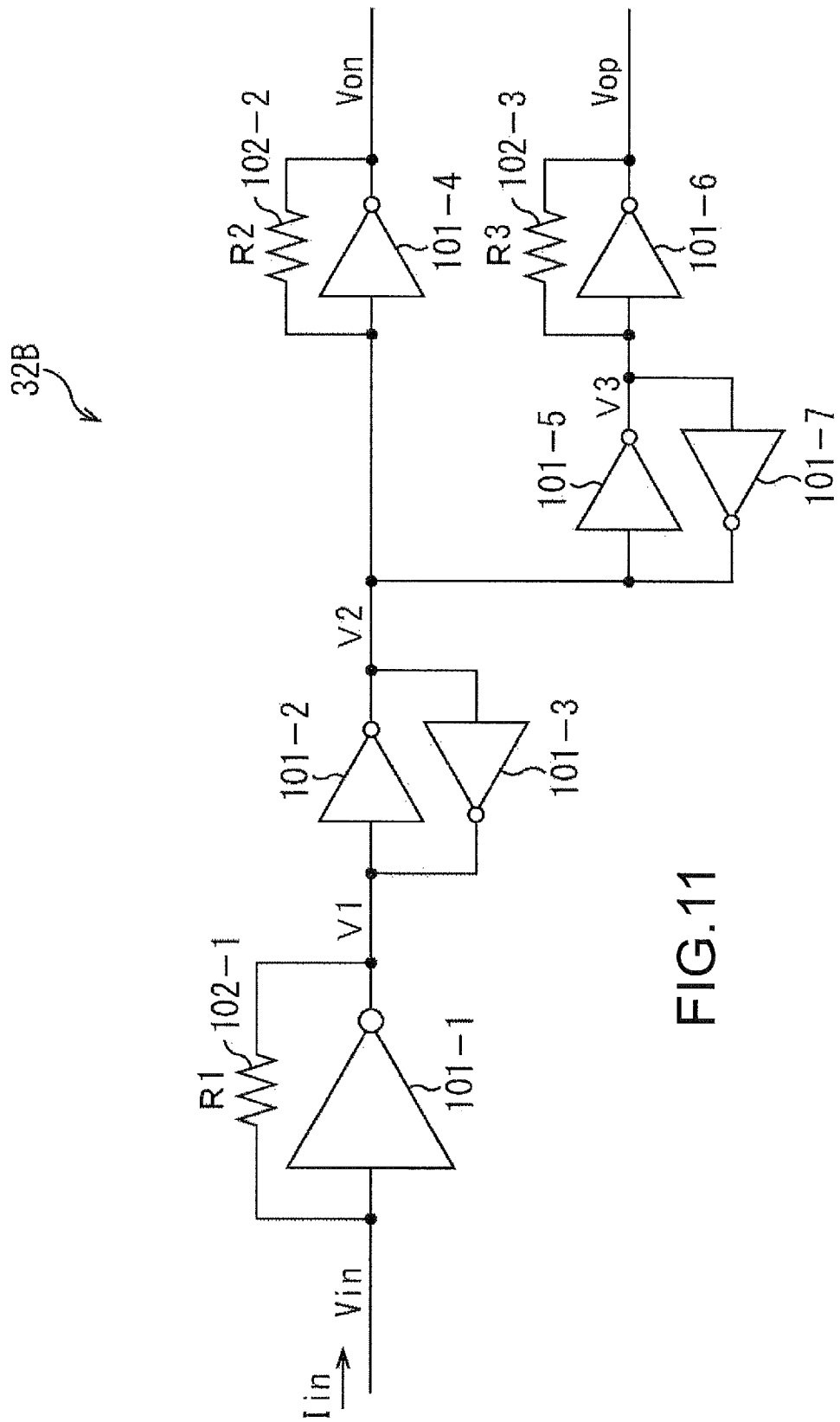
FIG. 11 shows a configuration of a current voltage conversion circuit according to a third embodiment of the present disclosure.

Next, FIG. 11 shows a configuration of the current voltage conversion circuit 32 according to a third embodiment of the present disclosure.

As shown in FIG. 11, a current voltage conversion circuit 32B is configured of the amplifiers 101-1 and 101-2, the feedback amplifier 101-3, the amplifier 101-4, the amplifier for generating a reverse phase signal 101-5, the amplifier 101-6, a feedback amplifier 101-7 and the feedback resistors 102-1 to 102-3. In other words, the current voltage conversion circuit 32B has a configuration that the feedback amplifier 101-7 is added to the current voltage conversion circuit 32A shown in FIG. 9. As to the configuration common to the current voltage conversion circuit 32A shown in FIG. 9, a detailed description is omitted.

In the current voltage conversion circuit 32B, the input terminal of the feedback amplifier 101-7 is connected to the node V3, and the output terminal of the feedback amplifier 101-7 is connected to the node V2.

Also in the current voltage conversion circuit 32B having such a configuration, a decrease in the high-frequency gain can be inhibited by the frequency properties of the transimpedance ZT1 of the circuit including the amplifier 52-1 in the first part and the feedback resistor 53-1 similar to the current voltage conversion circuit 32A, thereby providing good pass properties in the high frequency band.

Figure 12:
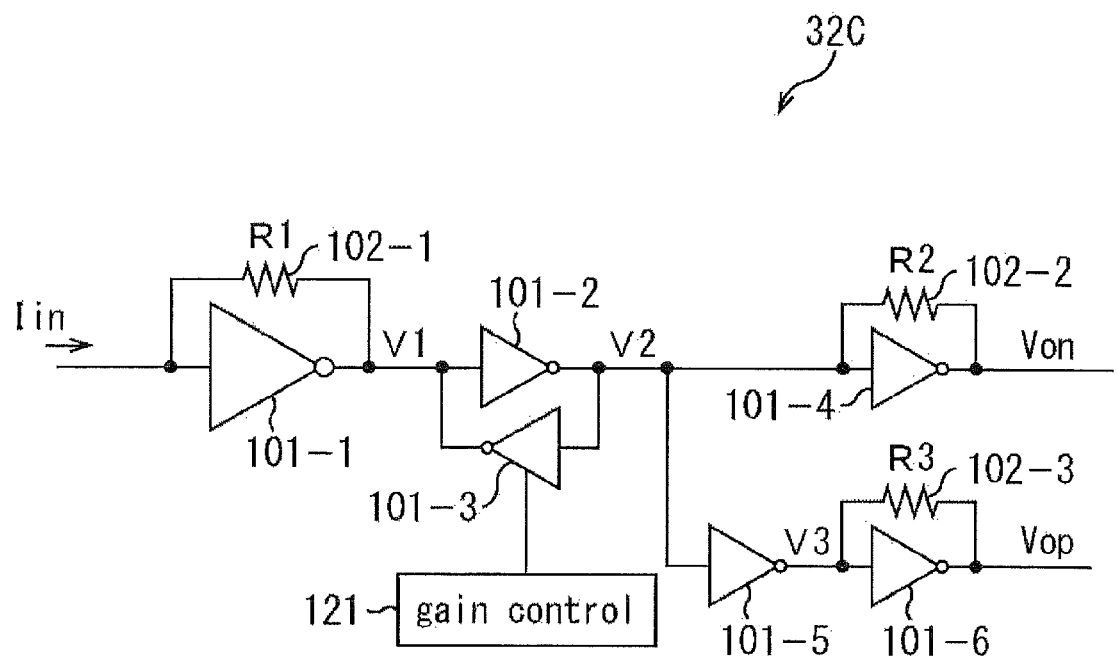
FIG. 12 shows a configuration of a current voltage conversion circuit according to a fourth embodiment of the present disclosure.

FIG. 12 is a block diagram showing the configuration of the current voltage conversion circuit 32 according to a fourth embodiment of the present disclosure.

As shown in FIG. 12, a current voltage conversion circuit 32C is configured of the amplifiers 101-1 and 101-2, the feedback amplifier 101-3, the amplifier 101-4, the amplifier for generating a reverse phase signal 101-5, the amplifier 101-6, the feedback resistors 102-1 to 102-3 and a gain control unit 121. In other words, the current voltage conversion circuit 32C has a configuration that the gain control unit 121 is added to the current voltage conversion circuit 32A shown in FIG. 9. As to the configuration common to the current voltage conversion circuit 32A shown in FIG. 9, a detailed description is omitted.

The gain control unit 121 can control an increased amount of the high-frequency gain of the transimpedance ZT1 of the amplifier 101-1 by adjusting the properties (for example, transconductance Gm and output conductance Gds) of the feedback amplifier 101-3. When the properties of the feedback amplifier 101-3 are controlled by following the change in the frequency properties of the transimpedance ZT1 of the amplifier 101-1 caused by changes in the process and the temperature, the frequency properties of the transimpedance ZT1 of the amplifier 101-1 can be flat.

Figure 13A:
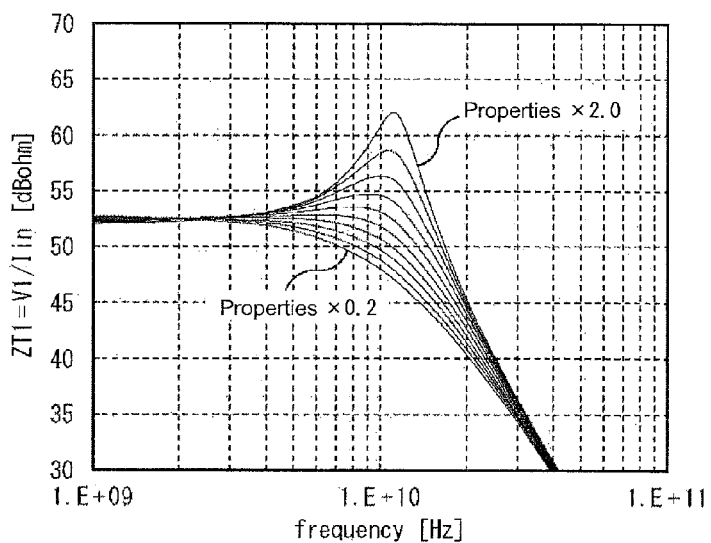
FIGS. 13A, 13B and 13C each shows properties of a feedback amplifier.
Figure 13B:
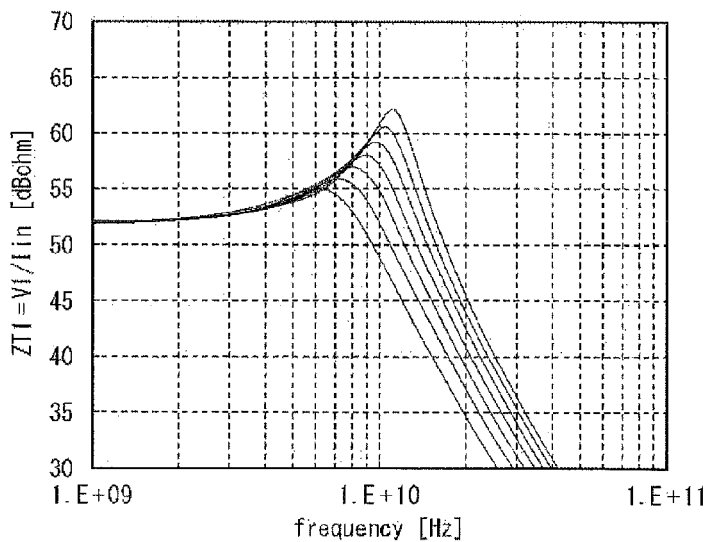

FIG. 13A shows the frequency properties of the feedback amplifier 101-3 according to the setting of the properties of the feedback amplifier 101-3. FIG. 13B shows a change in the transimpedance ZT1 of the amplifier 101-1 produced by process variations.

Figure 13C:
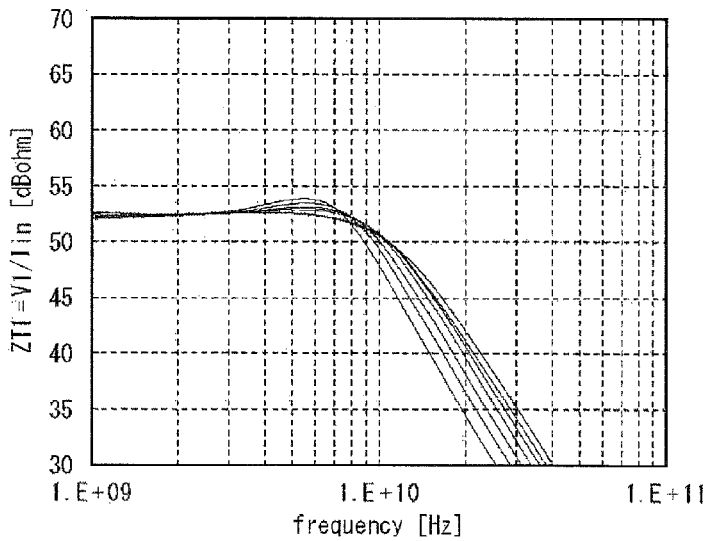

In the current voltage conversion circuit 32C, the gain control unit 121 controls the properties of the feedback amplifier 101-3, thereby correcting the variations of the transimpedance ZT1 of the amplifier 101-1. For example, even if the transimpedance ZT1 of the amplifier 101-1 is shown in FIG. 13B, the frequency properties shown in FIG. 13C can be provided by controlling the properties of the feedback amplifier 101-3.

Figure 14A:
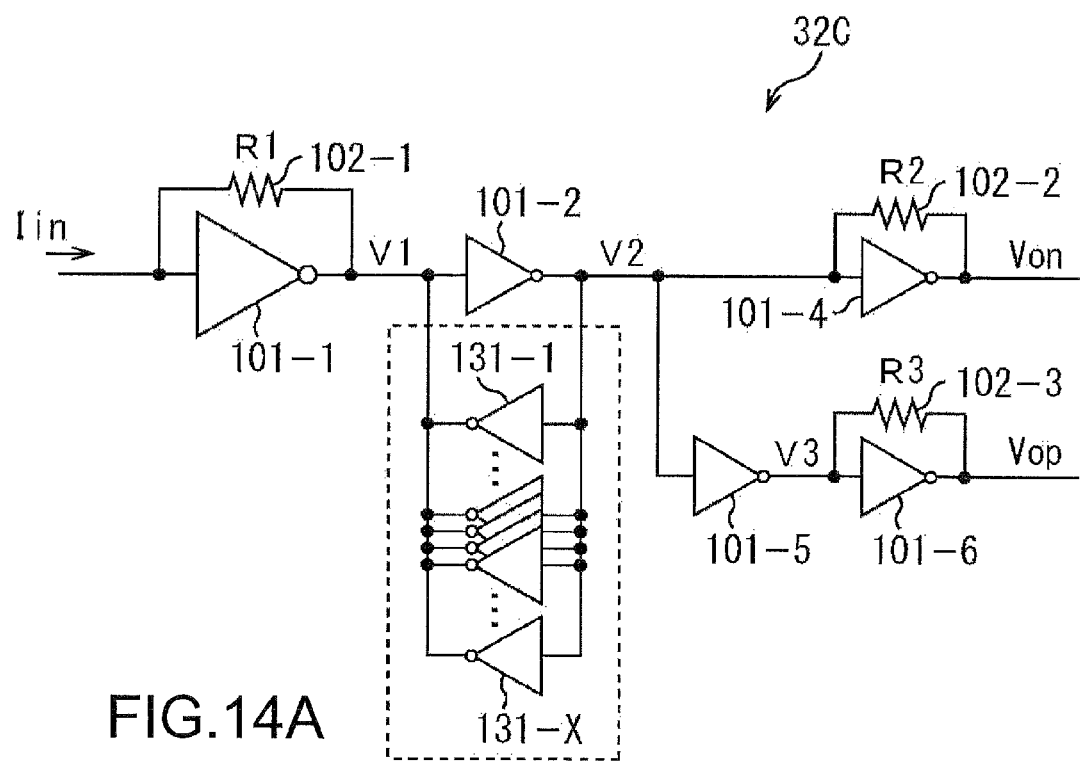
FIGS. 14A and 14B are each for illustrating a method of controlling the properties of the feedback amplifier.
Figure 14B:
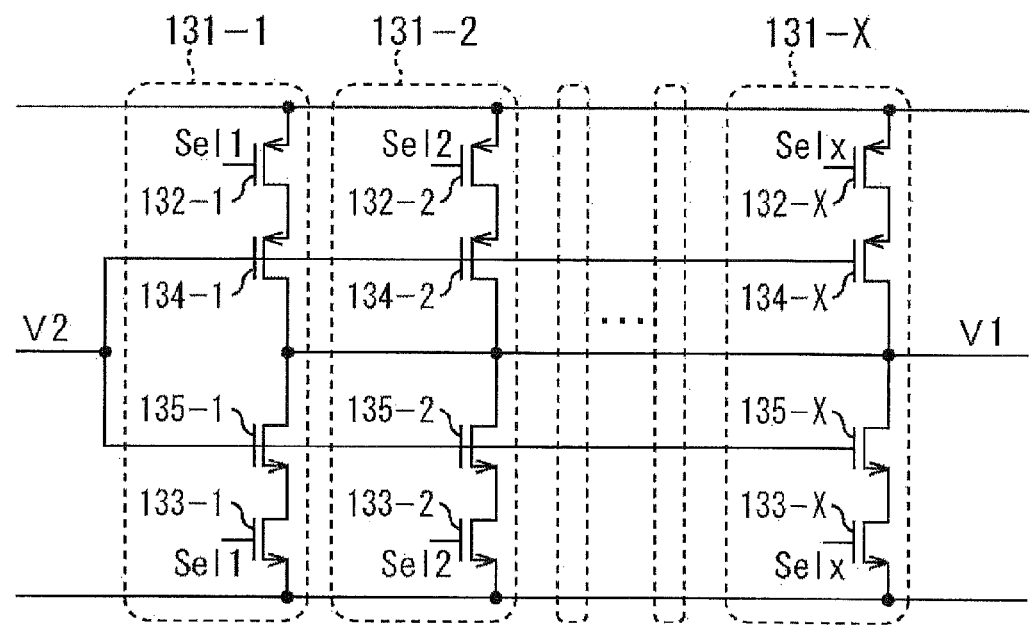

Referring to FIGS. 14A and 14B, a method of controlling the properties of the feedback amplifier 101-3 will be described.

For example, as shown in FIGS. 14A and 14B, the feedback amplifier 101-3 and the gain control unit 121 shown in FIG. 12 can be achieved by a configuration that x numbers of inverters 131-1 to 131-X are connected in parallel. In this case, in the inverters 131-1 to 131-X, switch MOS transistors 134-1 to 134-X are added to sources of the P type MOS transistors 132-1 to 132-X, and switch MOS transistors 135-1 to 135-X are added to sources of the N type MOS transistors 133-1 to 133-X. When row numbers of the inverters 131-1 to 131-X used in parallel are changed by the switch MOS transistors 134-1 to 134-X and the switch MOS transistors 135-1 to 135-X, the properties of the feedback amplifier 101-3 can be controlled.

Figure 15A:
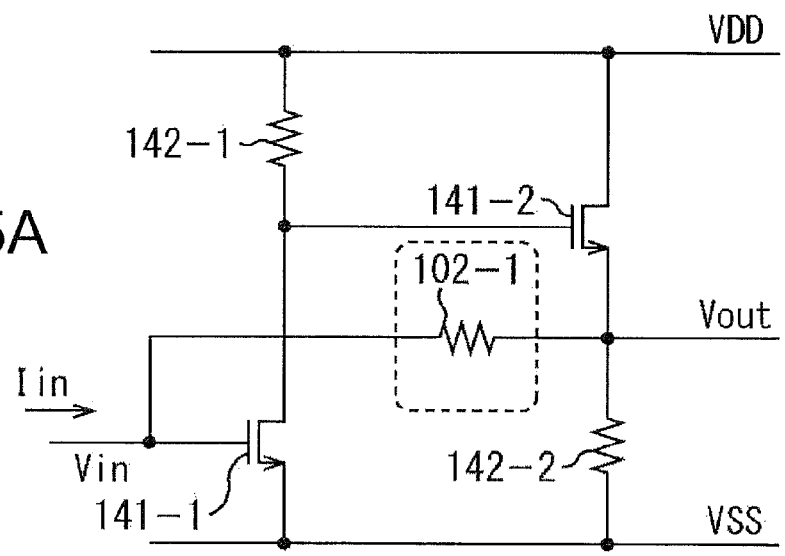
FIGS. 15A and 15B each shows a variation of gain controls.
Figure 15B:
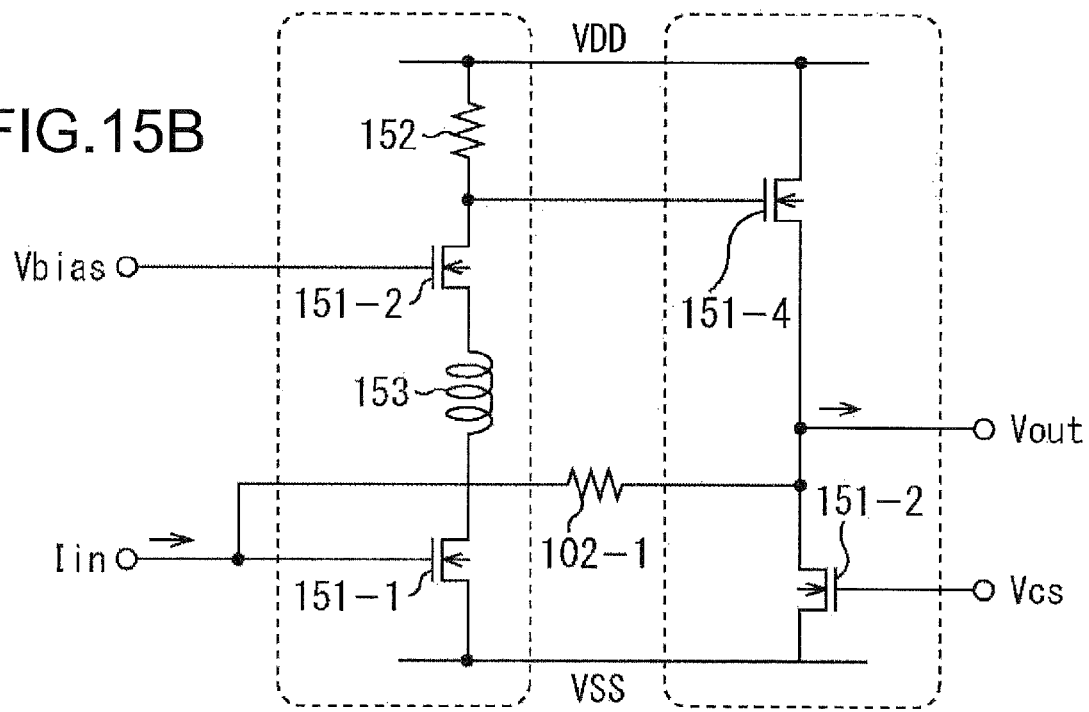

Next, FIGS. 15A and 15B each shows a variation of gain controls in the circuit including the first part amplifier 101-1 and the feedback resistor 102-1.

FIG. 15A shows a commonly used configuration. The amplifier 101-1 is composed of N type MOS transistors 141-1 and 141-2 and resistors 142-1 and 142-2. In a configuration shown in FIG. 15B, the amplifier 101-1 is composed of N type MOS transistors 151-1 to 151-4, a resistance 152 and an inductor 153.

Figure 16:
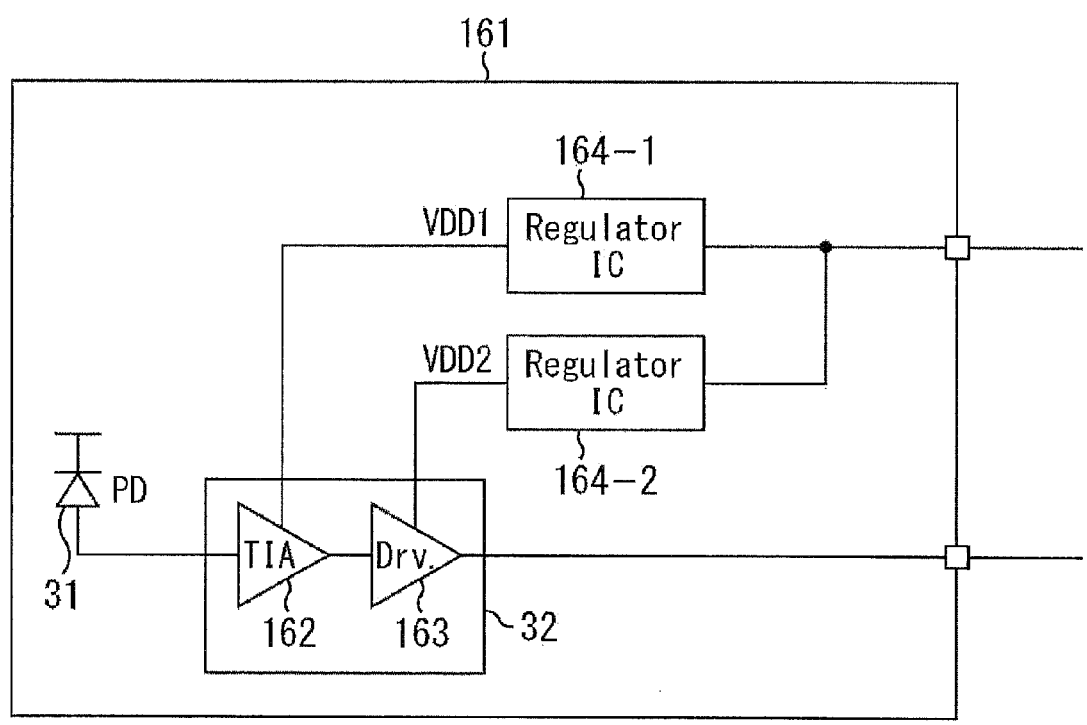
FIG. 16 shows a configuration embodiment of a module including the current voltage conversion circuit.

FIG. 16 shows a configuration embodiment of a module including the current voltage conversion circuit 32.

As shown in FIG. 16, a module 161 is configured of the light receiving element 31, the current voltage conversion circuit 32 and regulators 164-1 and 164-2. In FIG. 16, a first part circuit is a transimpedance amplifier 162 and a latter part circuit is a driver amplifier 163.

In the module 161 having such a configuration, the regulator 164-1 supplies power to the transimpedance amplifier 162, and the regulator 164-2 supplies power to the driver amplifier 163. In other words, separate power sources supply power to the transimpedance amplifier 162 and the driver amplifier 163, respectively.

Thus, as the transimpedance amplifier 162 is a sensitive circuit, the regulator 164-1 has to supply ideal power to the transimpedance amplifier 162. Therefore, by separating the power sources into the regulator 164-1 for supplying power to the transimpedance amplifier 162 and the regulator 164-2 for supplying power to the driver amplifier 163, it prevents the noise of the driver amplifier 163 from going around the transimpedance amplifier 162.

Next, referring to FIG. 17, a configuration embodiment of a light communication chip including a plurality of the current voltage conversion circuits 32 will be described.

Figure 17:
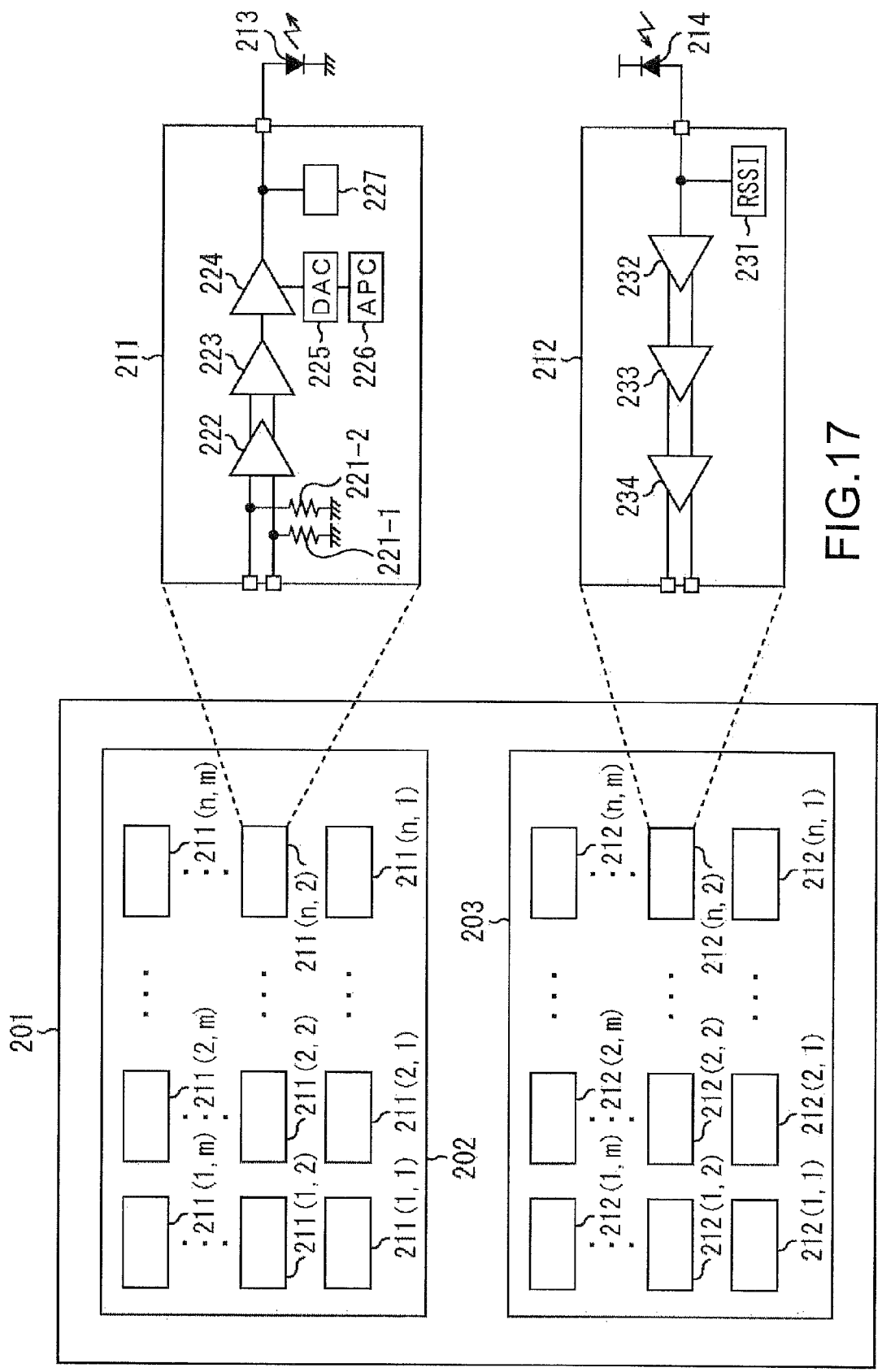
FIG. 17 shows a configuration embodiment of a light communication chip including a plurality of the current voltage conversion circuits.

As shown in FIG. 17, a light communication chip 201 is configured to have a light transmission block 202 and a light receiving block 203. For example, the light communication chip 201 is mounted on a light communication apparatus including both functions of the light transmission apparatus 12 and the light receiving apparatus 14. In other words, the light communication chip 201 can transmit a light signal like the light transmission apparatus 12 and receive the light signal like the light receiving apparatus 14 via the light transmission path 13.

In the light communication chip 201, the light transmission block 202 has a plurality of transmission units 211, and the light receiving block 203 has a plurality of receiving units 212. For example, in the configuration embodiment shown in FIG. 17, the light transmission block 202 includes the transmission units 211 (1, 1) to 211 (n, m) disposed on a single plane in m×n matrix. Similarly, the light receiving block 203 includes the receiving units 212 (1, 1) to 212 (n, m) disposed on a plane in m×n, where m and n are any integers.

In the light communication chip 201, each transmission unit 211 of the light transmission block 202 is connected to a light source for an optical communication 213, and each receiving unit 212 of the light receiving block 203 is connected to a light receiving element 214.

Accordingly, a plurality of the transmission units 211 included in the light transmission block 202 of one light transmission chip 201 can transmit a light signal from the light source for an optical communication 213 to a plurality of the receiving units 212 included in the light receiving block 203 of the other light transmission chip 201. A plurality of the receiving units 212 included in the light receiving block 203 of one light transmission chip 201 can receive a light signal transmitted from a plurality of the transmission units 211 included in the light transmission block 202 of the other light transmission chip 201 through the light receiving element 214.

The transmission unit 211 is configured to have resistances 221-1 and 221-2, an input buffer 222, a predriver 223, a laser diode driver (LDD) circuit 224, a Digital Analog Converter (DAC) circuit 225, an automatic power control (APC) circuit 226 and a laser diode monitor circuit 227.

The resistances 221-1 and 221-2 are connected between GND and two signal lines that input a differential signal supplied from a signal processing circuit (not shown). The input buffer 222 temporarily holds the differential signal supplied from the signal processing circuit (not shown), compensates a loss in a predetermined range of the high frequency, and ensures a predetermined data pulse width.

The predriver 223 amplifies the differential signal supplied from the input buffer 222 to a predetermined voltage, and supplies a single end voltage signal to the LDD circuit 224. The LDD circuit 224 converts the single end voltage signal supplied from the predriver 223 into a single end current signal, and supplies the single end current signal to the light source for an optical communication 213. The DAC circuit 225 converts a digital control signal outputted from the APC circuit 226 into an analog control signal, and supplies the analog control signal to the LDD circuit 224.

The APC circuit 226 outputs a control signal for controlling power of the current signal outputted from the LDD circuit 224 such that a light signal having a predetermined intensity is outputted from the light source for an optical communication 213. The laser diode monitor circuit 227 monitors the light source for an optical communication 213. Once abnormality is detected in the light source for an optical communication 213, an output of a current signal from the LDD circuit 224 to the light source for an optical communication 213 is stopped.

The receiving unit 212 is configured to have a Received Signal Strength Indicator (RSSI) 231, a transimpedance amplifier 232, a limiting amplifier 233 and an output buffer 234.

The RSSI 231 measures an intensity of a single end current signal supplied from the light receiving element 214 to a transimpedance amplifier 232.

The transimpedance amplifier 232 removes a DC component of the single end current signal supplied from the light receiving element 214, converts the single end current signal into a differential signal and outputs the differential signal. In other words, the transimpedance amplifier 232 utilizes the above-described respective current voltage conversion circuits 32.

The limiting amplifier 233 amplifies a differential signal outputted from the transimpedance amplifier 232 to a preliminarily set level, and outputs the differential signal amplified. The output buffer 234 temporarily holds the differential signal outputted from the limiting amplifier 233, and supplies the differential signal to a signal processing circuit where a received signal is processed via a signal line (not shown).

In this manner, a plurality of the receiving units 212 in the light communication chip 201 include the above-described respective current voltage conversion circuits 32 (transimpedance amplifiers 232), and the light communication chip 201 includes a plurality of the current voltage conversion circuits 32. In other words, current voltage conversion can be performed in parallel in a plurality of the current voltage conversion circuits 32 of the light communication chip 201. Accordingly, in a transmission and receiving apparatus including the light communication chip 201 and a light transmission system including the transmission and receiving apparatus, a signal can be transmitted at a high data rate as described above, when the light signal is received in parallel in the light receiving block 203. Also, as the transimpedance amplifier 232 can be made small, the light communication chip 201 can be made small. The light transmission block 202 and the light receiving block 203 may be independent from the light communication chip 201. The light receiving apparatus 14 (FIG. 1) may include the light receiving block 203.

Furthermore, in the light communication chip 201, the consumption power can be reduced, thereby suppressing heat generation in the light communication chip 201. In this way, the light communication chip 201, a voltage drop of the light source can be avoided, and an effect of the heat on the light communication can be suppressed. In the light communication chip 201, a cross talk between the transmission units 211 adjacent and a cross talk between the receiving units 212 adjacent can be decreased, whereby communication can be performed at a lower noise.

The present disclosure may have the following configurations.

(1) A current voltage conversion circuit, including:
first to fourth signal amplifiers for amplifying an input signal at a predetermined gain; and
first and second resistive passive elements for providing a predetermined resistivity value,
an input terminal of the first signal amplifier being connected to a terminal for inputting a current signal,
one terminal of the first resistive passive element being connected to an output terminal of the first signal amplifier, and the other terminal of the first resistive passive element being connected to the input terminal of the first signal amplifier,
an input terminal of the second signal amplifier being connected to a first connection point to which the output terminal of the first signal amplifier and one terminal of the first resistive passive element are connected,
an input terminal of the third signal amplifier being connected to an output terminal of the second signal amplifier, and an output terminal of the third signal amplifier being connected to the first connection point,
an input terminal of the fourth signal amplifier being connected to a second connection point to which the output terminal of the second signal amplifier and one terminal of the third signal amplifier are connected, and
one terminal of the second resistive passive element being connected to an output terminal of the fourth signal amplifier, and the other terminal of the second resistive passive element being connected to the second connection point.

(2) The current voltage conversion circuit according to (1) above, further including:
fifth and sixth signal amplifiers for amplifying an input signal at a predetermined gain; and
a third resistive passive element for providing a predetermined electrical resistivity value,
an input terminal of the fifth signal amplifier being connected to the second connection point,
an input terminal of the sixth signal amplifier being connected to an output terminal of the fifth signal amplifier, and
one terminal of the third resistive passive element being connected to an output terminal of the sixth signal amplifier, and the other terminal of the third resistive passive element being connected to a third connection point to which an output terminal of the fifth signal amplifier and an input terminal of the sixth signal amplifier are connected.

(3) The current voltage conversion circuit according to (2) above, further including:
a seventh signal amplifier for amplifying an input signal at a predetermined gain,
an input terminal of the seventh signal amplifier being connected to the third connection point, and an output terminal of the seventh signal amplifier being connected to the second connection point.

(4) The current voltage conversion circuit according to any one of (1) to (3) above, further including:
a control unit for controlling a gain of the third signal amplifier.

(5) A light receiving apparatus, including:
a light receiving element for receiving a light signal to be optically/electrically converted, and outputting a current signal corresponding to the light signal, and
a current voltage conversion circuit for converting a current signal outputted from the light receiving element into a voltage signal,
the current voltage conversion circuit, including:
first to fourth signal amplifiers for amplifying an input signal at a predetermined gain; and
first and second resistive passive elements for providing a predetermined resistivity value,
an input terminal of the first signal amplifier being connected to a terminal for inputting a current signal,
one terminal of the first resistive passive element being connected to an output terminal of the first signal amplifier, and the other terminal of the first resistive passive element being connected to the input terminal of the first signal amplifier,
an input terminal of the second signal amplifier being connected to a first connection point to which the output terminal of the first signal amplifier and one terminal of the first resistive passive element are connected,
an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

(6) The light receiving apparatus according to (5) above, in which a plurality of the current voltage conversion circuits are disposed, and the current voltage conversion can be performed in parallel in the respective current voltage conversion circuits.

(7) A light transmission system, including:

a light transmission apparatus including a current voltage conversion circuit for converting a signal light transmitted into a current signal, and a light source for an optical communication for converting the current signal converted in the current voltage conversion circuit into a light signal, and a light receiving apparatus including a light receiving element for receiving the light signal to be optically/electrically converted via a light transmission path, and outputting a current signal corresponding to the light signal, and a current voltage conversion circuit for converting a current signal outputted from the light receiving element into a voltage signal, the current voltage conversion circuit, including:

first to fourth signal amplifiers for amplifying an input signal at a predetermined gain; and first and second resistive passive elements for providing a predetermined resistivity value, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, and one terminal of the second resistive passive element being connected to an output terminal of the fourth signal amplifier, and the other terminal of the second resistive passive element being connected to the second connection point.

(8) The light transmission system according to (7) above, in which a plurality of the current voltage conversion circuits are disposed in the light receiving apparatus, and the current voltage conversion can be performed in parallel in the respective current voltage conversion circuits.

It should be understood by those skilled in the art that various modifications, combinations, sub-combinations and alterations may occur depending on design requirements and other factors insofar as they are within the scope of the appended claims or the equivalents thereof.

What is claimed is:

1. A current voltage conversion circuit, comprising:

first to fifth signal amplifiers for amplifying an input signal at a predetermined gain; and first and second resistive passive elements for providing a predetermined resistivity value, an input terminal of the first signal amplifier being connected to a terminal for inputting a current signal, one terminal of the first resistive passive element being connected to an output terminal of the first signal amplifier, and the other terminal of the first resistive passive element being connected to the input terminal of the first signal amplifier, an input terminal of the second signal amplifier being connected to a first connection point to which the output terminal of the first signal amplifier and one terminal of the first resistive passive element are connected, an input terminal of the third signal amplifier being connected to an output terminal of the second signal amplifier, and an output terminal of the third signal amplifier being connected to the first connection point, an input terminal of the fourth signal amplifier being connected to a second connection point to which the output terminal of the second signal amplifier and one terminal of the third signal amplifier are connected, one terminal of the second resistive passive element being connected to an output terminal of the fourth signal amplifier, and the other terminal of the second resistive passive element being connected to the second connection point, and an input terminal of the fifth signal amplifier being connected to the second connection point.

2. The current voltage conversion circuit according to claim 1, further comprising:

a sixth signal amplifier for amplifying an input signal at a predetermined gain; and a third resistive passive element for providing a predetermined electrical resistivity value, an input terminal of the sixth signal amplifier being connected to an output terminal of the fifth signal amplifier, and one terminal of the third resistive passive element being connected to an output terminal of the sixth signal amplifier, and the other terminal of the third resistive passive element being connected to a third connection point to which an output terminal of the fifth signal amplifier and an input terminal of the sixth signal amplifier are connected.

3. The current voltage conversion circuit according to claim 2, further comprising:

a seventh signal amplifier for amplifying an input signal at a predetermined gain, an input terminal of the seventh signal amplifier being connected to the third connection point, and an output terminal of the seventh signal amplifier being connected to the second connection point.

4. The current voltage conversion circuit according to claim 2, further comprising:

a control unit for controlling a gain of the third signal amplifier.

5. A light receiving apparatus, comprising:
a light receiving element for receiving a light signal to be optically/electrically converted, and outputting a current signal corresponding to the light signal, and
a current voltage conversion circuit for converting a current signal outputted from the light receiving element into a voltage signal,
the current voltage conversion circuit, comprising:
   first to fifth signal amplifiers for amplifying an input signal at a predetermined gain; and
   first and second resistive passive elements for providing a predetermined resistivity value,
   an input terminal of the first signal amplifier being connected to a terminal for inputting a current signal,
   one terminal of the first resistive passive element being connected to an output terminal of the first signal amplifier, and the other terminal of the first resistive passive element being connected to the input terminal of the first signal amplifier,
   an input terminal of the second signal amplifier being connected to a first connection point to which the output terminal of the first signal amplifier and one terminal of the first resistive passive element are connected,
   an input terminal of the third signal amplifier being connected to an output terminal of the second signal amplifier, and an output terminal of the third signal amplifier being connected to the first connection point,
   an input terminal of the fourth signal amplifier being connected to a second connection point to which the output terminal of the second signal amplifier and one terminal of the third signal amplifier are connected,
   one terminal of the second resistive passive element being connected to an output terminal of the fourth signal amplifier, and the other terminal of the second resistive passive element being connected to the second connection point, and
   an input terminal of the fifth signal amplifier being connected to the second connection point.

6. The light receiving apparatus according to claim 5, wherein
a plurality of the current voltage conversion circuits are disposed, and the current voltage conversion can be performed in parallel in the respective current voltage conversion circuits.

7. A light transmission system, comprising:
a light transmission apparatus including a voltage current conversion circuit for converting a signal light transmitted into a current signal, and a light source for an optical communication for converting the current signal converted in the voltage current conversion circuit into a light signal, and
a light receiving apparatus including a light receiving element for receiving the light signal to be optically/electrically converted via a light transmission path, and outputting a current signal corresponding to the light signal, and a current voltage conversion circuit for converting a current signal outputted from the light receiving element into a voltage signal,
the current voltage conversion circuit, comprising:
   first to fifth signal amplifiers for amplifying an input signal at a predetermined gain; and
   first and second resistive passive elements for providing a predetermined resistivity value,
   an input terminal of the first signal amplifier being connected to a terminal for inputting a current signal,
   one terminal of the first resistive passive element being connected to an output terminal of the first signal amplifier, and the other terminal of the first resistive passive element being connected to the input terminal of the first signal amplifier,
   an input terminal of the second signal amplifier being connected to a first connection point to which the output terminal of the first signal amplifier and one terminal of the first resistive passive element are connected,
   an input terminal of the third signal amplifier being connected to an output terminal of the second signal amplifier, and an output terminal of the third signal amplifier being connected to the first connection point,
   an input terminal of the fourth signal amplifier being connected to a second connection point to which the output terminal of the second signal amplifier and one terminal of the third signal amplifier are connected,
   one terminal of the second resistive passive element being connected to an output terminal of the fourth signal amplifier, and the other terminal of the second resistive passive element being connected to the second connection point, and
   an input terminal of the fifth signal amplifier being connected to the second connection point.

8. The light transmission system according to claim 7, wherein
a plurality of the current voltage conversion circuits are disposed in the light receiving apparatus, and the current voltage conversion can be performed in parallel in the respective current voltage conversion circuits.

9. The light receiving apparatus according to claim 5, the current voltage circuit further comprising:
a sixth signal amplifier for amplifying an input signal at a predetermined gain; and
a third resistive passive element for providing a predetermined electrical resistivity value,
an input terminal of the sixth signal amplifier being connected to an output terminal of the fifth signal amplifier, and
one terminal of the third resistive passive element being connected to an output terminal of the sixth signal amplifier, and the other terminal of the third resistive passive element being connected to a third connection point to which an output terminal of the fifth signal amplifier and an input terminal of the sixth signal amplifier are connected.

10. The light receiving apparatus according to claim 9, the current voltage circuit further comprising:
a seventh signal amplifier for amplifying an input signal at a predetermined gain,
an input terminal of the seventh signal amplifier being connected to the third connection point, and an output terminal of the seventh signal amplifier being connected to the second connection point.

11. The light receiving apparatus according to claim 9, further comprising:
a control unit for controlling a gain of the third signal amplifier.

12. The light transmission system according to claim 7, the current voltage circuit further comprising:

a sixth signal amplifier for amplifying an input signal at a predetermined gain; and a third resistive passive element for providing a predetermined electrical resistivity value, an input terminal of the sixth signal amplifier being connected to an output terminal of the fifth signal amplifier, and one terminal of the third resistive passive element being connected to an output terminal of the sixth signal amplifier, and the other terminal of the third resistive passive element being connected to a third connection point to which an output terminal of the fifth signal amplifier and an input terminal of the sixth signal amplifier are connected.

13. The light transmission system according to claim 12, the current voltage circuit further comprising:

a seventh signal amplifier for amplifying an input signal at a predetermined gain, an input terminal of the seventh signal amplifier being connected to the third connection point, and an output terminal of the seventh signal amplifier being connected to the second connection point.

14. The light transmission system according to claim 12, further comprising:

a control unit for controlling a gain of the third signal amplifier.

* * * * *